(12) United States Patent
Seo et al.

(10) Patent No.: US 10,535,792 B2
(45) Date of Patent: Jan. 14, 2020

(54) TRANSPARENT CONDUCTOR AND PREPARATION METHOD FOR SAME

(71) Applicants: N&B CO., LTD., Gongju-si, Chungcheongnam-do (KR); COSMO AM&T CO., LTD, Incheon (KR)

(72) Inventors: Chang Woo Seo, Cheonan-si (KR); Chang-Wan Bae, Incheon (KR)

(73) Assignee: N&B CO., LTD., Gongju-si (KR)

( * ) Notice: Subject to any disclaimer, the term of this patent is extended or adjusted under 35 U.S.C. 154(b) by 50 days.

(21) Appl. No.: 15/520,949

(22) PCT Filed: Oct. 28, 2015

(86) PCT No.: PCT/KR2015/011439
§ 371 (c)(1),
(2) Date: Apr. 21, 2017

(87) PCT Pub. No.: WO2016/068602
PCT Pub. Date: May 6, 2016

(65) Prior Publication Data
US 2017/0345965 A1    Nov. 30, 2017

(30) Foreign Application Priority Data
Oct. 28, 2014 (KR) .................. 10-2014-0147735

(51) Int. Cl.
*H01L 31/18* (2006.01)
*H01B 1/22* (2006.01)
(Continued)

(52) U.S. Cl.
CPC ............ *H01L 31/1884* (2013.01); *B32B 7/02* (2013.01); *B32B 37/04* (2013.01); *H01B 1/22* (2013.01);
(Continued)

(58) Field of Classification Search
CPC ..... H01L 31/1884; H01L 31/022466–022475; H01L 31/022483; H01L 31/022491;
(Continued)

(56) References Cited

U.S. PATENT DOCUMENTS

| 8,486,537 B2 | 7/2013 | Whitcomb et al. |
| 9,199,438 B2 | 12/2015 | Bories-Azeau et al. |

(Continued)

FOREIGN PATENT DOCUMENTS

| CN | 102421600 | 4/2012 |
| JP | 2009-277640 | 11/2009 |

(Continued)

OTHER PUBLICATIONS

International Search Report for corresponding International PCT Application No. PCT/KR2015/011439, dated Feb. 4, 2016.

*Primary Examiner* — Michael M Trinh
(74) *Attorney, Agent, or Firm* — Hauptman Ham, LLP

(57) ABSTRACT

A preparation method for a transparent conductor, according to the present invention, comprises the steps of: a) preparing a laminate which has a transparent polymer layer and a conductive network sequentially laminated on a base material; and b) sinking the conductive network into the transparent polymer layer by applying energy to the laminate.

25 Claims, 2 Drawing Sheets

(51) Int. Cl.
*B32B 7/02* (2019.01)
*B32B 37/04* (2006.01)
*H01L 31/0224* (2006.01)
*H01B 5/14* (2006.01)

(52) U.S. Cl.
CPC ....... *H01B 5/14* (2013.01); *H01L 31/022466* (2013.01); *B32B 2262/103* (2013.01)

(58) Field of Classification Search
CPC ........... H01L 51/442; H01B 1/22; H01B 5/14; H01B 13/0013; H01B 13/003; B32B 7/02; B32B 7/023; B32B 2262/103; B32B 2262/106; B32B 37/04; B32B 37/06; B32B 37/144
See application file for complete search history.

(56) References Cited

U.S. PATENT DOCUMENTS

| | | | | |
|---|---|---|---|---|
| 2007/0065651 | A1* | 3/2007 | Glatkowski | B82Y 30/00 428/297.4 |
| 2009/0056854 | A1* | 3/2009 | Oh | B32B 27/12 156/60 |
| 2010/0243295 | A1* | 9/2010 | Allemand | B82Y 10/00 174/250 |
| 2011/0232945 | A1 | 9/2011 | Whitcomb et al. | |
| 2012/0118617 | A1* | 5/2012 | Bories-Azeau | B32B 33/00 174/255 |
| 2012/0132930 | A1* | 5/2012 | Young | H01L 31/0481 257/84 |
| 2013/0266898 | A1 | 10/2013 | Whitcomb | |
| 2013/0273357 | A1 | 10/2013 | Whitcomb et al. | |
| 2014/0017483 | A1 | 1/2014 | Whitcomb | |
| 2014/0202531 | A1* | 7/2014 | Oya | H01B 1/22 136/256 |
| 2014/0295179 | A1 | 10/2014 | Naito et al. | |
| 2015/0056382 | A1* | 2/2015 | Suganuma | H01B 1/22 427/553 |

FOREIGN PATENT DOCUMENTS

| | | |
|---|---|---|
| JP | 2012-527071 | 11/2012 |
| JP | 2013-084628 | 5/2013 |
| JP | 2013-206809 | * 10/2013 |
| KR | 10-2012-0087804 | 8/2012 |
| KR | 10-2013-0035158 | 4/2013 |
| KR | 10-2013-0048287 | 5/2013 |
| KR | 10-2013-0072064 | 7/2013 |
| KR | 10-2013-0079279 | 7/2013 |
| WO | 2010/082428 | 7/2010 |

* cited by examiner

TRANSPARENT CONDUCTOR AND PREPARATION METHOD FOR SAME

TECHNICAL FIELD

The present invention relates to a transparent conductor and a preparation method thereof, and more specifically, to a transparent conductor having a remarkably high binding force between an insulating substrate and a conductive film, a uniform and low sheet resistance, and high transmittance, and a preparation method thereof.

BACKGROUND ART

A transparent conductor means a thin conductive film coated on an insulating substrate of high light transmittance. The transparent conductor has appropriate optical transparency and has surface conductivity. The transparent conductor having surface conductivity is widely used as a transparent electrode in fields where both transparency and conductivity are simultaneously required, such as flat liquid crystal displays, touch panels, electroluminescent devices, and photovoltaic cells, etc., and is also widely used as anti-static layers or as electromagnetic wave shielding layers.

Metal oxides such as indium tin oxide (ITO) have excellent optical transparency and electrical conductivity, but have disadvantages in that they are easily damaged by physical impact and are not physically deformable, and have limitation in that high cost is required, and a high-temperature process is required at the time of preparation.

A conductive polymer has problems in that not only electrical characteristics and optical characteristics are deteriorated but also chemical and long-term stability are deteriorated.

Accordingly, a demand for the transparent conductor capable of having excellent electrical and optical characteristics, stably maintaining physical properties thereof over a long period of time, and being physically deformable has been continuously increased.

In accordance with this demand, the transparent conductor having a structure in which a network of conductive nanowires such as silver nanowires is embedded in an organic matrix, on an insulating substrate, as described in Korean Patent Laid-Open Publication No. 2013-0135186, has been developed.

However, such a transparent conductor is able to be physically bent, but has weak adhesion force with the insulating substrate, and thus, there is a problem in view of durability, and there is a limitation in that electrical characteristics of a surface are not uniform.

DISCLOSURE

Technical Problem

An object of the present invention is to provide a transparent conductor capable of having a remarkably high binding force between a substrate and a conductive film to maintain stable electrical characteristics even under repeated physical deformations over a long period of time, having a uniform and low sheet resistance even in a large area, and having excellent transmittance, and a preparation method thereof.

Technical Solution

In one general aspect, a preparation method of a transparent conductor includes: a) preparing a laminate in which a transparent polymer layer and a conductive network are sequentially laminated on a substrate; and b) applying energy to the laminate so that the conductive network sinks into the transparent polymer layer.

The applied energy may be heat energy, light energy, or heat and light energy.

Step b) may include applying energy to the laminate to heat a transparent polymer of the transparent polymer layer of the laminate to a glass transition temperature or higher so that the conductive network sinks into the transparent polymer layer.

The applied energy may include at least heat energy.

The energy applied in step b) may include at least heat energy, and step b) may include heating the transparent polymer layer of the laminate to a glass transition temperature (Tg) of the transparent polymer or higher.

The energy applied in step b) may include at least light energy, and in step b), light irradiation may be performed with infrared ray (IR), ultraviolet ray (UV), visible light, microwave or a combination thereof.

The conductive network may be a network of one or two or more nano units selected from conductive nanowires, conductive nanotubes, and conductive nanobelts.

The conductive network may be a network of one or two or more nano units selected from silver nanowires, silver nanobelts, carbon nanotubes, carbon nanowires, and carbon nanobelts.

The conductive network may have a porous structure in which the nano units are physically bonded to each other or a porous structure in which the nano units are formed in contact with or entangled with each other.

A transparent polymer of the transparent polymer layer may have a glass transition temperature of 80 to 140° C.

A transparent polymer of the transparent polymer layer may be one or a mixture of two or more selected from polyester, polyethylene terephthalate (PET), acrylate (AC), polybutylene terephthalate, polymethyl methacrylate (PMMA), acrylic resin, polycarbonate (PC), polystyrene, triacetate (TAC), polyvinyl alcohol, polyvinyl chloride, polyvinylidene chloride, polyethylene, ethylene-vinylacetate copolymers, polyvinyl butyral, metal ion-crosslinked ethylene-methacrylic acid copolymers, polyurethane, cellophane, and polyolefin.

Step a) may include a1) forming a coating film by coating a first solution containing a transparent polymer or a polymerization unit of the transparent polymer onto the substrate; and a2) drying the coating film.

Polymerizing the transparent polymer or the polymerization unit of the transparent polymer of the coating film may be further performed after step a2) or simultaneously with step a2).

The transparent polymer layer may be patterned or non-patterned.

Step a) may include a3) coating a dispersion liquid in which one or two or more nano units selected from conductive nanowires, conductive nanotubes, and conductive nanobelts are dispersed in a dispersion medium on a surface of the transparent polymer layer of the substrate on which the transparent polymer layer is formed.

After step a3), irradiating the coating film on which the dispersion liquid is coated with a light including infrared ray (IR) to dry the coating film may be further performed.

The dispersion liquid may further contain an organic binder.

The organic binder may be a natural polymer or a synthetic polymer in which a molecular weight (a weight average molecular weight, Mw) is $5\times10^5$ or less.

The organic binder may be one or two or more selected from the group consisting of polysaccharide, polysaccharide derivative, polyethylene glycol (PEG), polyvinylpyrrolidone (PVP), and polyvinylalcohol (PVA), wherein the polysaccharide may include glycogen, amylose, amylopectin, callose, agar, algin, alginate, pectin, carrageenan, cellulose, chitin, chitosan, curdlan, dextran, fructane, collagen, gellan gum, gum arabic, starch, xanthan, gum tragacanth, carayan, carabean, glucomannan, or a combination thereof, and the polysaccharide derivative may include cellulose ester or cellulose ether.

A conductive material of the conductive network may have an optical activity including a surface plasmon or a photocatalytic ability.

The preparation method may include: a first light irradiation step of irradiating nano units coated on a surface of the transparent polymer layer with a first light including a first ultraviolet ray (UV); and a second light irradiation step of irradiating the nano units irradiated with the first ultraviolet ray with a second light including a pulse-type first white light.

The second light may further include second ultraviolet ray, second infrared ray, or second ultraviolet ray and second infrared ray.

The first light may further include a pulse-type second white light.

In the second light irradiation step, step b) may be performed. That is, the conductive network may sink into the transparent polymer layer by the second light irradiation step.

The first white light and the second white light may include light at a wavelength corresponding to a light absorption peak of the nano unit in a UV-visible light spectroscopy spectrum of the nano unit, respectively.

The present invention includes a transparent conductor prepared by the preparation method as described above.

In another general aspect, a transparent conductor includes: a substrate; and a composite layer on the substrate, wherein the composite layer includes a transparent polymer layer having a glass transition temperature (Tg) of 80° C. or more; and a conductive network embedded in the transparent polymer layer, the conductive network includes a network of one or two or more nano units selected from nanowires, nanotubes, and nanobelts, and a density of the nano unit in an upper region having a thickness of 5% from a surface which is an opposite surface of a lower surface of the composite layer, the lower surface being a surface in contact with the substrate of the composite layer, is relatively larger than a density of the nano unit in a lower region having a thickness of 5% from the lower surface, based on the total thickness of the composite layer.

In another general aspect, a transparent conductor includes: a substrate; and a composite layer on the substrate, wherein the composite layer includes a transparent polymer layer having a glass transition temperature (Tg) of 80° C. or more; and a conductive network partially embedded in the transparent polymer layer, and the conductive network includes a network of one or two or more nano units selected from nanowires, nanotubes, and nanobelts.

In another general aspect, a transparent conductor includes: a composite layer in which a conductive network sinks into a transparent polymer layer formed on a substrate, wherein the conductive network includes a network of one or two or more nano units selected from nanowires, nanotubes, and nanobelts.

The transparent conductor may have a light transmittance of 90% or more, and a haze of 1.5% or less.

The transparent conductor may have a sheet resistance uniformity of 90% or more as defined by Relational Equation 1 below based on an area of at least 20 mm×20 mm:

sheet resistance uniformity (%)=[1−(sheet resistance standard deviation)/sheet resistance average)]× 100.   (Relational Equation 1)

The transparent conductor may have a sheet resistance increase rate of 1.4 or less as defined by Relational Equation 2 below in a bending test in which the transparent conductor is bent 1,000 times with a radius of curvature of 1 cm:

sheet resistance increase rate=sheet resistance after bending test/sheet resistance before bending test.   (Relational Equation 2)

The transparent conductor may have an average sheet resistance of 100 ohm/sq or less.

The conductive network may have a porous structure in which the nano units are physically bonded to each other or a porous structure in which the nano units are formed in contact with or entangled with each other.

Advantageous Effects

The transparent conductor according to the present invention may have a significantly excellent binding force with a substrate, uniform and excellent surface conductivity even in a large area, significantly high light transmittance, and low haze characteristic.

In addition, the transparent conductor according to the present invention may be patterned through a significantly easy and simple process, and further, may have a planar shape in which patterned surfaces (side surfaces of the transparent conductor) are very well-defined, and thus, it is possible to form very fine patterns and precise patterns.

According to the preparation method of the present invention, it is possible to mass-produce the transparent conductor having the above-described excellent characteristics by a very simple method, and to prepare the transparent conductor having excellent transparency and a low sheet resistance within a very short period of time under normal atmospheric conditions without damaging the polymer substrate which is particularly vulnerable to heat, and thus, it is easy to apply the transparent conductor to a roll-to-roll process, which makes it possible to mass-produce a flexible transparent electrode.

BEST MODE

Figure 1:
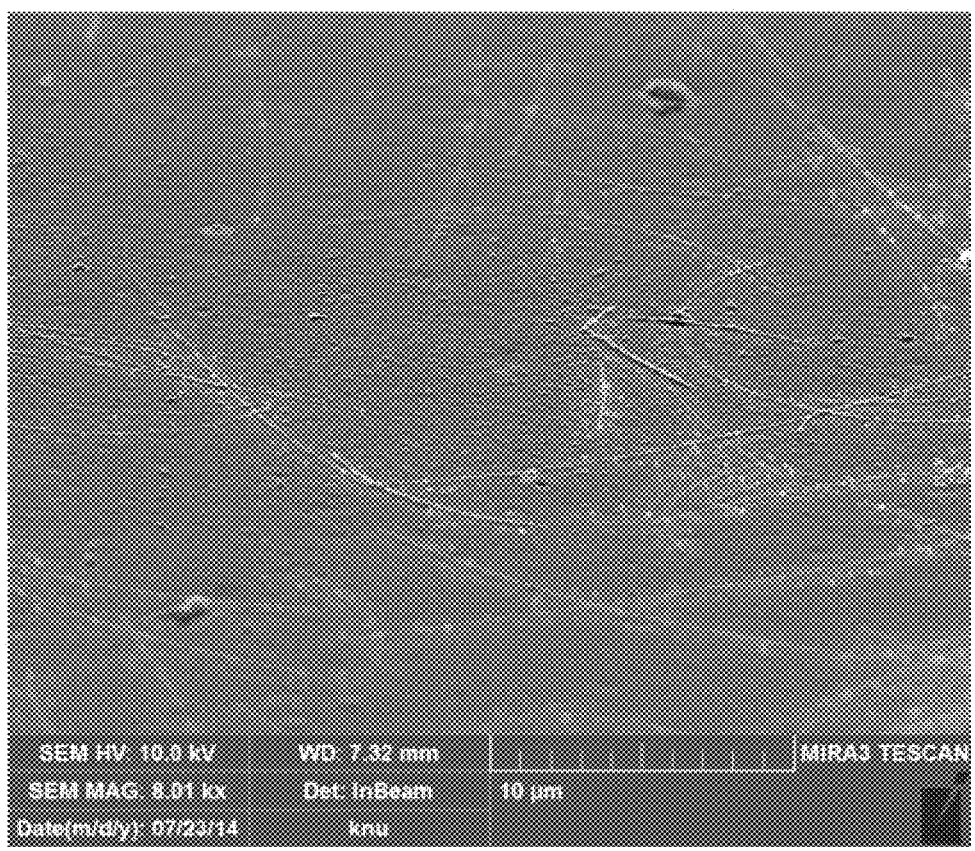
FIG. 1 is a scanning electron microscope (SEM) image showing a surface of a transparent conductor prepared in Example 2 of the present invention.

Hereinafter, a transparent conductor of the present invention and a preparation method thereof will be described in detail. Here, unless technical and scientific terms used herein are defined otherwise, they have meanings generally understood by those skilled in the art to which the present invention pertains. Description of known functions and components that may obscure the gist of the present invention will be omitted from the following description and the accompanying drawings.

In general, in order to prepare a transparent conductor based on a conductive nanowire network, a method of preparing a transparent conductor by coating a solution in which silver nanowires are dispersed to an insulating substrate, followed by drying, thereby forming a silver nanowire network, and then, overcoating an additional polymer binder material on the silver nanowire network is performed.

However, this method is disadvantageous in that as the polymer binder material having an insulation property is overcoated, surface conductivity of the transparent conductor may be lowered, surface conductivity may be changed depending on positions, etc., and thus, uniformity of the sheet resistance may be lowered. Together with the reduction in electrical characteristics, a bigger problem is that a binding force between the insulating substrate and a composite layer which is a silver nanowire network covered with the polymer binder material, is deteriorated, and thus, the transparent conductor is vulnerable to repetitive physical deformations.

In order to solve problems of the conventional transparent conductor, the present applicant conducted a an extensive research, and found that when a transparent conductor is prepared by forming a transparent polymer layer on a substrate at first, and then, applying energy to the laminate so that a conductive network sink into the softened transparent polymer layer, the prepared transparent conductor could have a significantly improved binding force between the substrate and the conductive network embedded in a transparent polymer, a uniform sheet resistance even in a large area, and very excellent surface conductivity. In addition, when the transparent polymer layer is softened to sink the conductive network to prepare the composite layer of the transparent polymer and the conductive network, the composite layer is able to have a very smooth surface similar to that prepared by overcoating, and further, it is possible to implement high light transmittance and low haze characteristics.

Further, it is possible to form a physically integral conductive network and to sink a physically integral conductive network into the transparent polymer layer not only by heat energy but also by light energy, and thus, the transparent conductor is able to be mass-produced in a large area in a short period of time, by a continuous process, thereby having very high commercial utility value. Further, there is provided a method for implementing uniform and excellent electrical characteristics in a large area, which is regarded as a technical difficulty in preparation of a transparent electrode using light energy.

The preparation method of a transparent conductor according to the present invention includes: a) preparing a laminate in which a transparent polymer layer and a conductive network are sequentially laminated on a substrate; and b) applying energy to the laminate so that the conductive network sinks into the transparent polymer layer.

That is, according to the preparation method of a transparent conductor of the present invention, the transparent conductor may be prepared by a method in which the conductive network is formed on the transparent polymer layer of the substrate on which the transparent polymer layer is formed so that the conductive network is in contact with the transparent polymer layer, and then, energy is applied to soften a transparent polymer layer region in contact with at least the conductive network, and thus, the conductive network sinks into the transparent polymer layer.

As described above, the entire transparent polymer layer may be softened by applying energy, or alternatively, the region in contact with the conductive network in the transparent polymer layer may be partially softened. Here, term 'softening' of the transparent polymer may mean that the transparent polymer material forming the transparent polymer layer is heated to a glass transition temperature or higher and a temperature lower than a melting temperature by the applied energy.

When the conductive network is firstly formed on the substrate, and then, the transparent polymer as a binder is overcoated as described in the related art, the binding force with the substrate, electrical uniformity, and surface conductivity are deteriorated. Specifically, due to the overcoating of the transparent polymer coated on the conductive network, conductive nano units constituting the conductive networks receive force to be pushed to the substrate. In addition, degrees of movement due to the force applied by the overcoating varies depending on the presence or position, etc., of other nano units in contact with one nano unit or located at upper and lower portions on the basis of the one nano unit. Further, after the overcoating is completed (coating and curing of the transparent polymer is completed), all of the nano units are buried in the transparent polymer. In addition, as the transparent polymer used as the binder is overcoated, the transparent polymer may be partially bonded to the substrate, through void space between the substrate and the conductive network.

However, the preparation method of a transparent conductor according to an exemplary embodiment of the present invention includes forming the transparent polymer layer on the substrate at first, and then, applying energy so that the conductive network sinks into the soften transparent polymer layer as described above, and thus, it is possible to manufacture the transparent conductor having uniform electrical characteristics and excellent surface conductivity without substantially impairing the binding force with the substrate. Further, the transparent conductor may be prepared by a method of applying energy to soften the transparent polymer layer so that the conductive network sinks, and thus, the surface of the transparent conductor (surface of the transparent polymer) may be significantly smooth so as to be comparable to that of the transparent conductor prepared by overcoating, thereby remarkably preventing a decrease in light transmittance and deterioration in haze characteristic due to fine surface irregularities.

Substrate

In an exemplary embodiment according to the present invention, the substrate means an insulating substrate and may serve as a support. A substrate may be appropriately selected in consideration of use of the transparent conductor. Optically, the substrate may be a transparent substrate or an opaque substrate. The substrate may be a rigid substrate or a flexible substrate in view of physical properties. The substrate may be appropriately selected depending on the use of the transparent conductor. Examples of the substrate may include the rigid substrate such as glass, polycarbonate, acrylic polyethylene terephthalate (PET), etc. Examples of the substrate may include the flexible substrate such as a polyester-based substrate such as polyester naphthalate and polycarbonate; a polyolefin-based substrate such as linear, branched, and cyclic polyolefins; a polyvinyl-based substrate such as polyvinyl chloride, polyvinylidene chloride, polyvinyl acetal, polystyrene and polyacryl; a cellulose ester base substrate such as cellulose triacetate and cellulose acetate; a polysulfone substrate such as polyethersulfone; a polyimide substrate; a silicon substrate; or the like. However, the present invention is not limited by the substrate. The substrate may have a thin film form, a film form, etc., but may have a suitable form which is appropriate to the use of the transparent conductor.

Transparent Polymer Layer

In an exemplary embodiment of the present invention, the transparent polymer of the transparent polymer layer may be a polymer in which the same repeating units are polymerized. Here, the polymer in which the same repeating units are polymerized may include two or more polymers having different polymerization degrees from each other. Alternatively, independently, the transparent polymer layer may contain one or two or more polymers in which different repeating units are polymerized. Alternatively, independently, the transparent polymer of the transparent polymer layer may include two or more polymers having different polymerization degrees and/or repeating units from each other.

In an exemplary embodiment of the present invention, the transparent polymer of the transparent polymer layer may have a glass transition temperature (Tg) of 80 to 140° C., specifically, 100 to 140° C., and more specifically, 110 to 130° C. This temperature has a temperature range at which the conductive network may be stably and reproducibly formed on the transparent polymer layer, and damage of other components such as the substrate may be prevented by the energy applied to the transparent polymer to sink the conductive network into the transparent polymer layer thereafter. Further, the glass transition temperature of the transparent polymer is a temperature at which thermal stability is capable of being secured at the time of using the prepared transparent conductor.

In an exemplary embodiment of the present invention, the transparent polymer of the transparent polymer layer may be heated by applying energy, specifically, may be heated to the glass transition temperature (Tg) of the transparent polymer or higher and a temperature lower than the melting temperature (Tm) of the transparent polymer, thereby being softened, and the conductive network may sink into the softened transparent polymer.

The flexible polymer may be used as the substrate to have flexible properties or to be applied to commercial processes such as a roll-to-roll process. In such a case, the transparent polymer may be heated to the temperature higher than the glass transition temperature (Tg), but may be heated to a temperature at which the flexible polymer as the substrate is not thermally damaged. As a specific example, the transparent polymer of the transparent polymer layer may be heated to a temperature of 1 to 1.2 times higher than the glass transition temperature (Tg) by applying energy. The glass transition temperature (Tg) is 80 to 140° C., specifically 100 to 140° C., and more specifically 110 to 130° C. When the transparent polymer is heated to the temperature of 1 to 1.2 times higher than the glass transition temperature (Tg), a transparent conductor may be stably prepared even on a substrate having a very low heat resistance characteristic such as a polyethylene terephthalate substrate. Further, when the transparent polymer is heated to the temperature of 1 to 1.2 times higher than the glass transition temperature (Tg), it is possible to maintain patterned shape while the conductive network may sink even if the transparent polymer layer is micropatterned to prepare a fine patterned transparent conductor.

In an exemplary embodiment of the present invention, the transparent polymer of the transparent polymer layer may have a single glass transition temperature or two or more glass transition temperatures (Tg). As a specific example, the transparent polymer may have one, two, three or four glass transition temperatures.

In the transparent conductor according to an exemplary embodiment of the present invention, when the transparent polymer has two or more glass transition temperatures, the lowest glass transition temperature among the two or more glass transition temperatures of the transparent polymer may be 80 to 140° C., specifically, 100 to 140° C., and more specifically, 110 to 130° C.

When the transparent polymer has the two or more glass transition temperatures, the transparent polymer of the transparent polymer layer may be heated to the lowest glass transition temperature or higher to less than the highest glass transition temperature by applying energy, thereby being softened, and the conductive network may sink into the softened transparent polymer layer.

Here, a temperature difference of the transparent polymer between the highest glass transition temperature (the highest glass transition temperature among the two or more glass transition temperatures) and the lowest glass transition temperature may be 5 to 100° C., specifically 5 to 50° C., and more specifically, 5 to 20° C. The lowest glass transition temperature and the temperature difference between the highest glass transition temperature and the lowest glass transition temperature described above is a range in which damage to the substrate having a low heat resistance characteristic such as a polyethylene terephthalate substrate may be prevented while the stable conductive network may sink, and as described above, a range in which a shape may be stably maintained when the transparent polymer layer is patterned.

In an exemplary embodiment of the present invention, the transparent polymer of the transparent polymer layer may satisfy Relational Equation 1 below:

$$TS(\%) \leq 0.1 \qquad \text{(Relational Equation 1)}$$

In Relational Equation 1, TS is a heat shrinkage at the glass transition temperature of a transparent polymer film which is the transparent polymer having a film form (the transparent polymer of the transparent polymer layer). Specifically, the TS is a heat shrinkage at the glass transition temperature (° C.) (that is, the lowest glass transition temperature when having two or more glass transition temperatures) of the transparent polymer on the basis of the transparent polymer film which is the transparent polymer having a film form in which width×length×thickness is 100 mm×100 mm×0.188 mm. Here, the heat shrinkage of the transparent polymer film in a width direction, or a length direction or a thickness direction may satisfy Relational Equation 1 above, and preferably, the heat shrinkage in all of the width direction, the length direction, and the thickness direction may satisfy Relational Equation 1 above. It is preferred that the heat shrinkage does not occur, and thus, the lower limit of Relational Equation 1 may be 0, and substantially, 0.01.

In an exemplary embodiment according to the present invention, in the transparent polymer layer, a change in yellow index ΔYI before and after heating to the glass transition temperature (° C.) (that is, the lowest glass transition temperature when the transparent polymer has the two or more glass transition temperatures) of the transparent polymer may be 0.5 or less at a thickness of 0.5 μm.

The transparent polymer layer may be firstly formed on the substrate, and then, the transparent polymer may be heated to the glass transition temperature or higher so that the conductive network sinks into the softened transparent polymer layer, and therefore, it is advantageous in that the transparent polymer of the transparent polymer layer is a material in which the shrinkage according to heating and cooling is not caused as much as possible, and the change in yellow index is not caused as much as possible. However, when light sintering and the sink of the conductive network are simultaneously performed by application of light energy described below, a part of the transparent polymer layer (a transparent polymer region in contact with the conductive network of the laminate) may be softened and the conductive network may sink. Accordingly, when the light energy is applied as described below, the transparent polymer material of the transparent polymer layer does not have to satisfy the above-described conditions of heat shrinkage and/or change in yellow index.

In an exemplary embodiment of the present invention, a contact angle of the transparent polymer of the transparent polymer layer may be 90° or less on the conductive thin film made of the same material as that of the conductive network. This contact angle characteristic is more effective in an attempt where a conductive network composed of very thin or thin nano units sinks into the softened transparent polymer layer only by gravity. This is because when the conductive network sinks to the transparent polymer heated to the glass transition temperature or higher due to the gravity applied to the conductive network without the application of a separate external force, the smaller the size of the nano unit, the more the contact angle characteristic may affect the sinking rate. Specifically, when a material of the conductive network and the transparent polymer material of the transparent polymer layer have the contact angle of 90° or less, even if the conductive network is formed of very fine nano units, the conductive network may stably and easily and reproducibly sink into the transparent polymer layer by gravity.

The transparent polymer of the transparent polymer layer may be any polymer as long as it has optical transparency and satisfies the above-described conditions.

As a practical example of the material, the transparent polymer of the transparent polymer layer may be one or a mixture of two or more selected from polyester, polyethylene terephthalate (PET), acrylate (AC), polybutylene terephthalate, polymethyl methacrylate (PMMA), acrylic resin, polycarbonate (PC), polystyrene, triacetate (TAC), polyvinyl alcohol, polyvinyl chloride, polyvinylidene chloride, polyethylene, ethylenevinylacetate copolymers, polyvinyl butyral, metal ion-crosslinked ethylene-methacrylic acid copolymers, polyurethane, cellophane, and polyolefin, but is not limited thereto. As a more specific example, the transparent polymer of the transparent polymer layer may be one or two or more materials selected from nonionic urethane and acryl. Here, the transparent polymer may have a weight average molecular weight of 100 to 500,000,000, but the weight average molecular weight is not limited thereto.

In the examples of the specific materials of the transparent polymer, physical properties satisfying the proposed glass transition temperature, heat shrinkage, change in yellow index, and/or contact angle, etc., may be achieved by using various known methods such as kinds of materials, polymerization degree, molecular weight distribution, mixing ratios of different materials, introduction of functional groups, additives, etc.

In an exemplary embodiment of the present invention, a thickness of the transparent polymer layer may be appropriately controlled in consideration of the use of the transparent conductor. For example, the thickness of the transparent polymer layer may be 50 nm to 10 μm, and specifically, 50 nm to 2000 nm, but is not limited thereto.

In an exemplary embodiment of the present invention, the transparent polymer layer may be a single film made of a single transparent polymer material or a laminated film in which different transparent polymers are stacked while forming each layer. In the case of the laminated film, a film of the transparent polymer (hereinafter, referred to as a surface film) having a lower glass transition temperature among the transparent polymers constituting the laminated film may be located in contact with the conductive network. By controlling the thickness of the surface film with respect to the thickness of the entire laminated film in the laminated film, the position where the conductive network sinks may be controlled. That is, when the energy is applied, the surface film may be more softened as compared to a lower film of the laminated film so that the conductive network may selectively sink in the surface film region in the laminated film. However, even when the transparent polymer layer is a single film, a degree at which the conductive network sinks into the transparent polymer layer may be controlled by controlling external process factors such as the applied energy, time to sink, cooling, etc.

In an exemplary embodiment of the present invention, step a) may include a1) forming a coating film by coating a first solution containing a transparent polymer or a polymerization unit of the transparent polymer onto the substrate; and a2) drying the coating film.

Here, a step of polymerizing the transparent polymer or the polymerization unit of the transparent polymer of the coating film may be further performed after step a2) or simultaneously with step a2). The polymerization step may be performed when the first solution contains the polymerization unit or a curable transparent polymer in which the transparent polymer has curability.

As described above, when the first solution contains the transparent polymer having curability or contains the polymerization unit, curing may be performed after the first solution is coated and dried on the substrate, or in a step of drying the first solution. Here, the curing may include photocuring, thermosetting or chemical curing.

However, a polymer having no curability may also be used, and in the case of the polymer having no curability, the transparent polymer layer may be formed by coating and drying the first solution on the substrate.

In an exemplary embodiment of the present invention, the transparent polymer layer formed on the substrate may be patterned or nonpatterned. Here, the nonpatterning means that the shape of the transparent polymer layer is not intentionallly controlled. Specifically, the nonpatterning may mean a transparent polymer layer covering a predetermined area of the substrate with a simple film. The patterning means that the control into the intentional shape is performed so as to have a shape different from the coated shape. In consideration of the use of the transparent conductor, the transparent conductor may have a pattern suitable for the use, and may be patterned in various forms such as a grid shape, a fish-bone shape, an interdigitate shape, a fine line shape, etc., but the present invention is not limited by the pattern shape of the transparent polymer layer.

The patterning of the transparent polymer layer may be performed by coating the first solution with a patterned state using a printing method that is able to be coated with specific patterns such as gravure printing, etc., and then, simply drying or drying and curing the coating film.

When the first solution contains a polymer or a polymerizable units having curability, the coating film of the first solution may be partially cured according to designed patterns, and thus, the patterning of the transparent polymer layer may be achieved. For example, the patterning of the transparent polymer layer may be achieved by partially curing the coating film and removing uncured materials, such as a photomask in which light is transmitted only through a designated area and light irradiation using the photomask.

Independently, the patterning may be performed by partially removing the transparent polymer material using an etching mask and dry etching or wet etching after the simple drying or drying and curing of the coating film are performed.

The feature that the transparent polymer layer may be patterned in advance to manufacture the patterned transparent conductor is an advantage that is able to be realized by the technical feature of the present invention in which the conductive network sinks into the transparent polymer layer, thereby preparing the transparent conductor. When a transparent conductive film is prepared by overcoating after the conductive network is formed on the substrate as described in the related art, the overcoating is performed, and a binder polymer used for the overcoating is cured in a patterned state, and an uncured part is removed, or the binder polymer is all cured without patterning, and then, the binder polymer and the conductive network are partially removed by etching, etc., thereby patterning the transparent conductive film.

The conventional patterning is not only complicated in process and increases cost, but also has a problem that since the conductive network is already present in the binder polymer at the time of the patterning, a side surface of the patterned transparent conductive film is very uneven and coarse, and thus, it is difficult to perform precise patterning.

However, the transparent polymer layer may be firstly patterned according to the method feature in which the transparent polymer layer is firstly formed on the substrate, and then, the transparent polymer is heated to the glass transition temperature (the lowest glass transition temperature or higher among two or more glass transition temperatures), thereby being softened, and the conductive network sinks into the softened transparent polymer layer according to an exemplary embodiment of the present invention. Accordingly, it is possible to have a plane in which the side surface of the patterned transparent conductor is very well-defined, and further, it is possible to perform very precise patterning.

That is, after the transparent polymer layer itself formed on the substrate is patterned, and then, the conductive network is allowed to sink into the patterned transparent polymer layer, and thus, the patterning may be advantageously performed regardless of the conductive network.

A solvent of the first solution may be used as long as it dissolves the transparent polymer or the polymerization units of the transparent polymer and does not chemically react with the substrate. It is known that depending on the material of the transparent polymer or the polymerization unit, the solvent dissolving the corresponding material may be appropriately selected. For example, the solvent may be a polar solvent, a non-polar solvent, a polar aprotic solvent or a polar quantum solvent. As a non-limiting example, the solvent may include gamma-butyrolactone, formamide, N,N-dimethylformamide, diformamide, acetonitrile, tetrahydrofuran, dimethyl sulfoxide, diethylene glycol, 1-methyl-2-pyrrolidone, N,N-dimethylacetamide, acetone, α-terpineol, β-terpineol, dihydro terpineol, 2-methoxy ethanol, acetylacetone, methanol, ethanol, propanol, butanol, pentanol, hexanol, ketone, methyl isobutyl ketone, pentaene, hexene, cyclohexene, 1,4-dioxene, benzene, toluene, triethylamine, chlorobenzene, ethylamine, ethyl ether, chloroform, ethyl acetate, acetic acid, 1,2-dichlorobenzene, tert-butyl alcohol, 2-butanol, isopropanol, methyl ethyl ketone, etc., but is not limited thereto. However, it is more advantageous to use a solvent having a low boiling point in order to remove volatilization more rapidly after coating, among various solvents that dissolve the corresponding transparent polymer or the polymerization unit of the transparent polymer.

Here, the first solution may further include various additives for improving physical properties of the polymer such as a crosslinking agent, a polymerization initiator, a stabilizer, a polymerization inhibitor, a surfactant, an antioxidant, a yellowing inhibitor, an anti-shrinkage agent, etc., and may further include various additives for satisfying characteristics required for a coating method to be used, such as a viscosity adjusting agent for controlling a viscosity of the first solution.

The coating of the first solution may be performed by any method which has been previously used for preparing a film having a uniform thickness by applying and drying a liquid phase in fields for manufacturing a semiconductor or a display. For example, the coating may be performed by various methods such as coating, spraying, and printing, etc. Specific examples thereof may include spin coating; bar coating; gravure coating; blade coating; roll coating; a slot die; etc., but the present invention is limited by the coating method of the first solution.

In the preparation method according to an exemplary embodiment of the present invention, when the transparent polymer of the first solution has curability, the conductive network may be formed on the previously cured transparent polymer layer. That is, when the transparent polymer has no curability, a step of forming the conductive network may be performed after the coating and drying of the first solution is completed. When the first solution contains the transparent polymer having curability or the polymerization unit, the step of forming the conductive network may be performed after the coating, drying, and curing of the first solution is completed. Accordingly, the laminate may include the conductive network formed on the transparent polymer layer in a rigid state by drying (when the transparent polymer has no curability) or curing (when the transparent polymer has curability).

Conductive Network

In an exemplary embodiment of the present invention, the conductive network may refer to a structure in which a continuous charge transfer path is provided by at least physical contact between the nano units having conductivity.

The nano unit may be one or two or more selected from conductive nanowires, conductive nanotubes, and conductive nanobelts.

The nano unit may be composed of a single material or two or more different materials. That is, the nano unit may be a single conductive material having a nanostructure. Alternatively, when the nano unit is composed of two or more materials, the nano unit may be obtained by coating a non-conductive material having a nanostructure with another conductive material. As a specific example in which the nano unit is composed of two or more materials, a core-shell structure composed of a nonconductive core and a conductive shell, or a core-shell structure composed of a conductive core and a conductive shell, may be included. Here, a material constituting the core may be a light-transmitting material. The core-shell structure may be suitable when significantly high light transmittance is required.

The material of the nano unit may be used as long as it has conductivity. As an example, the material of the nano unit may be one or two or more materials selected from a metal; a semiconductor which has conductivity due to doping, defects, or the like, or is able to transfer electrons or holes due to characteristics of the material itself; a conductive inorganic material; and a conductive organic material.

In consideration of excellent conductivity and prevention of reduction in transparency, examples of the nano unit may include silver nanowires, silver nanobelts, carbon nanotubes, carbon nanowires, carbon nanobelts, etc., and the conductive network may be a network of one or two or more nano units selected from silver nanowires, silver nanobelts, carbon nanotubes, carbon nanowires, and carbon nanobelts. However, the present invention is not limited by the material of the nano unit.

In an exemplary embodiment according to the present invention, the conductive network may be a network of conductive nano unit having optical activity. The conductive nano unit having an optical activity may mean a conductive nano unit that generates surface plasmon and/or a conductive nano unit that has photocatalytic ability. The conductive nano unit having such an optical activity is more suitable than a case where physical integration of the conductive network and the sink of the conductive network into the transparent polymer layer are performed by the light energy, as described below.

As well known in a plasmonic field, the surface plasmon refers to a phenomenon in which a plasmon, which is a collective movement of free electrons of a metal, is intensively formed on the surface of a metal unit due to interaction between a metal having nano dimension and light. The conductive nano unit that generates surface plasmon may be nanowires, nanotubes, or nanobelts of any metal known to generate surface plasmon. As a specific example, the conductive nano unit having surface plasmon may be nanowires, nanotubes and/or nanobelts of one or two or more materials selected from gold, silver, copper, lithium, aluminum, and an alloy thereof, etc., but the present invention is not limited thereto.

The photocatalytic ability means an ability to promote chemical reaction by receiving light energy. The chemical reaction may be a reaction in which organic materials are decomposed, and the photocatalytic ability may be a photocatalytic ability in which the organic materials are decomposed. The conductive nano unit having photocatalytic ability may provide electron pathway or hole pathway, and may be nanowires of any material known to promote the chemical reaction by light. Specific examples of the conductive nano unit that provides the electron pathway and has the photocatalytic ability may include nanowires, nanotubes and/or nanobelts of one or more metal oxides selected from titanium oxide, zinc oxide, and tin oxide, etc. Specific examples of the conductive nano unit that is the metal and has photocatalytic ability may include noble metal nanowires, noble metal nanotubes, and/or noble metal nanobelts including gold, silver, platinum, etc., but the present invention is not limited thereto.

Further, the conductive nano unit having surface plasmon may be interpreted as having both surface plasmon and photocatalytic ability, which is consistent with the fact that an anisotropically structural material having surface plasmon has the photocatalytic ability.

In an exemplary embodiment according to the present invention, as long as required characteristics are satisfied, the conductive network may further include additional conductive elements such as conductive particles or conductive plates together with the nano units. As a specific example of the conductive plate, graphene may be included.

A size of the nano unit may be sufficient as long as electrical characteristics required for use are satisfied, and the network is able to be stably formed. As a specific example, in the conductive nanowire or the conductive nanotube, an aspect ratio of the nano unit may be 50 to 20,000, and as a more practical example, an average diameter thereof may be 5 to 100 nm and an average length thereof may be 5 to 100 μm.

In an exemplary embodiment of the present invention, the conductive network may have a porous structure in which the nano units are physically bonded to each other or a porous structure in which the nano units are formed in contact with or entangled with each other. That is, the conductive network may have a porous network structure in which the nano units are physically bonded to form integration or may be a nano unit network in which the nano units are formed in contact with or entangled with each other.

Here, the porous network structure may refer to a structure in which the nano units are formed in contact with or entangled with each other to form a network, wherein the nano units in contact with or entangled with each other are bonded (or fused) to each other to form a physically integral structure. In addition, the nano unit network may refer to a structure in which nano units are regularly or irregularly contacted with or entangled with each other to provide a continuous charge pathway.

When the conductive network has a physically integrated porous structure (porous network structure), a laminate may be manufactured by locating the already integrated conductive network on the transparent polymer layer. Independently, a dispersion liquid in which the nano units are dispersed is coated and dried on the transparent polymer layer, thereby forming the nano unit network in which the nano units are formed in contact with or entangled with each other, followed by integration so that the conductive network sinks into the transparent polymer layer.

In an exemplary embodiment according to the present invention, a mass per unit area of the conductive network may be 0.0001 to 0.01 g/cm$^2$, and specifically, 0.0001 to 0.001 g/cm$^2$. The mass per unit area of the conductive network may refer to a mass of the conductive network located at an upper part of a corresponding unit surface area per unit surface area, based on the surface of the transparent polymer layer in contact with the conductive network. The conductive network may be appropriately controlled depending on the aspect ratio of the nano unit, etc. However, a stable and low resistant conductive network is able to be generated by the nano units while preventing the light transmittance from being lowered, by the mass per unit area of the conductive network described above.

In an exemplary embodiment of the present invention, the laminate may contain 1 to 30 parts by weight, specifically 5 to 30 parts by weight, and more specifically 5 to 15 parts by weight of the conductive network, based on 100 parts by weight of the transparent polymer of the transparent polymer layer. The content of the conductive network has a range in which a stable conductive path is formed by the nano unit and the transmittance is not excessively inhibited while preparing the transparent conductor having excellent physical stability.

The step of forming the conductive network may include coating a dispersion liquid containing the conductive nano unit and a dispersion medium on the transparent polymer layer. Here, the dispersion medium of the coated dispersion liquid may be volatilized and removed, and the network of the conductive nano unit may be formed on the transparent polymer layer. The dispersion liquid may contain 0.01 to 70 parts by weight of the conductive nano unit based on 100 parts by weight of the dispersion medium, but the present invention is not limited by the content of the nano unit in the dispersion liquid.

The dispersion medium may be used as long as it is a liquid material that does not dissolve the transparent polymer layer and does not chemically react with the transparent polymer layer. That is, the dispersion medium may be a non-solvent of the transparent polymer. Here, the description that the liquid material does not dissolve the transparent polymer may mean a solvent in which a solubility of the transparent polymer is less than 0.01 wt %, specifically less than 0.001 wt %, and more specifically less than 0.0001 wt %, and substantially zero, at 20° C. under 1 atmosphere. Since the dispersion medium is the non-solvent of the transparent polymer, it is possible to prevent the transparent polymer layer from being damaged in the process of applying and drying the dispersion liquid on the transparent polymer layer. That is, the surface of the transparent polymer layer may be maintained as a smooth surface even after the conductive network may be formed on the transparent polymer layer, thereby preventing deterioration in transparency, deterioration in haze characteristic, etc., due to surface irregularities.

The dispersion liquid may further include additives such as a dispersing agent for improving dispersibility, a corrosion inhibitor, a binder for improving physical stability of the coated conductive network, etc., together with the conductive nano unit and the dispersion medium.

The coating of the dispersion liquid may be performed by any method which has been previously used for preparing a film having a uniform thickness by applying and drying a liquid phase in fields for manufacturing a semiconductor or a display. For example, the coating may be performed by various methods such as coating, spraying, and printing, etc. Specific examples thereof may include spin coating; screen printing; ink-jet printing; bar coating; gravure coating; blade coating; roll coating; a slot die; spray method; etc., but the present invention is limited by the coating method of the conductive nano unit dispersing agent.

Here, the mass per unit area of the conductive nano unit located at the upper part of the transparent polymer layer may be controlled by controlling an amount of the conductive nano unit in the dispersion liquid and/or a coated amount of the dispersion liquid, etc.

After the dispersion liquid is coated, if necessary, the coating film may be dried before the energy is applied so that the conductive network sinks. When the coating film is dried, it is preferred that the drying is performed under the condition that the transparent polymer layer is maintained at a temperature lower than the glass transition temperature. The coated film may be dried through natural drying, heat light irradiation including infrared rays, drying with hot air, a method using dried air flow, heating using a heat source, etc. However, the drying step is not performed separately, but the drying may be performed simultaneously at the time of applying energy so that the conductive network sinks.

Independently, when the drying step is performed, after the conductive nano unit dispersion liquid is applied to the substrate, a heat light irradiation step in which the conductive nano unit coated on the substrate is irradiated with light including infrared rays (IR) may be performed. The drying by light including infrared rays may prevent damage to the substrate due to drying even if the substrate is vulnerable to heat since heat transfer through the substrate is not required, and further, even the coated film in a large area is able to be homogeneously dried in a short time, and thus, the transparent conductor is very suitable for a continuous process including roll-to-roll. An intensity of the infrared rays may be sufficient as long as the transparent polymer layer is not softened, and the dispersion medium is capable of being volatilized.

Energy Application

In the preparation method according to an exemplary embodiment of the present invention, the energy applied to the laminate may be used as long as it is any kind of energy capable of heating the transparent polymer of the transparent polymer layer to the glass transition temperature or higher.

Specifically, the energy applied to the laminate may be heat energy, light energy, or heat and light energy.

The heat energy may include joule heat. The heat energy may be applied either directly or indirectly, wherein the direct application may mean that heat source and the substrate on which the laminate is formed are in a physical contact state. The indirect application may mean that the heat source and the substrate on which the laminate is formed are in a physically non-contact state. As a non-limiting example, the direct application may include a method in which a heating element for generating a joule heat by a current flow is located in a lower portion of the substrate, thereby transferring the heat energy to the transparent polymer layer through the substrate. As a non-limiting example, the indirect application may include a method in which the heat source is located to be spaced apart from the substrate on which the laminate is formed by a predetermined distance, thereby transferring the heat energy to the transparent polymer layer through a fluid (including air) present between the transparent polymer layer and the heat source. As a non-limiting example, the indirect application may include a method using a general heat treatment furnace including a heat resistant material preventing heat loss by surrounding a space in which heat treatment objects such as a tube, etc., are located, and a heating element located inside the heat resistant material.

Specifically, the light energy may include infrared rays (IR), ultraviolet rays (UV), visible light, microwave, or a combination thereof, and the application of light energy may include light irradiation on the transparent polymer layer. As a non-limiting example, a light source spaced apart from the substrate on which the laminate is formed by a predetermined distance may be located, and the transparent polymer layer may be irradiated with light.

In an exemplary embodiment of the present invention, the energy application may be performed by applying either heat energy or light energy alone. Independently, the energy application may include simultaneous or sequential application of heat energy and light energy.

The sequential application may mean that another kind of energy (for example, light energy) is applied again after one kind of energy (for example, heat energy) is applied or during the application of one kind of energy.

In addition, the sequential application may mean that different kinds of energy are applied to the transparent polymer layer continuously or discontinuously.

When the energy is applied, an atmosphere included in the substrate on which the laminate is formed, may be sufficient as long as it is an atmosphere in which unwanted chemical reactions are not caused. As a practical example, the atmosphere when energy is applied may be an air atmosphere, but the present invention is not limited by such an atmosphere.

Hereinafter, the application of the heat energy and the application of the light energy are described in more detail. However, as described above, both the application of the heat energy and the application of the light energy may be used, and various conditions for applying energy using heat and light so that the conductive network sinks into the transparent polymer layer may be derived by those skilled in the art with reference to the description of the present invention. As an example, heat energy may be applied under the condition that the transparent polymer layer is heated to a temperature lower than the glass transition temperature by heat energy alone, and the transparent polymer layer that maintains a constant temperature by applying heat energy may be irradiated with light, and finally, the transparent polymer of the transparent polymer layer may be heated to the glass transition temperature or higher by the combination of the light energy and the heat energy to be irradiated. As another example, heat energy may be applied to heat the transparent polymer layer to the glass transition temperature or higher, while simultaneously applying light energy, and thus, the conductive network may more quickly sink into the transparent polymer layer.

Application of Heat Energy

After the step of preparing a laminate is performed, a step of heating the transparent polymer layer to have the glass transition temperature or higher of the transparent polymer so that the conductive network sinks into the transparent polymer layer (the sink step) may be performed.

When the transparent polymer of the transparent polymer layer has a single glass transition temperature, in the sink step, the transparent polymer layer of the laminate may be heated to the glass transition temperature or higher and a temperature lower than a melting temperature. Specifically, the transparent polymer layer located on the substrate may be heated to a temperature of 1 to 1.2 times higher than the glass transition temperature (Tg). The transparent polymer of the transparent polymer layer may have a single glass transition temperature of 80 to 140° C., specifically 100 to 140° C., and more specifically 110 to 130° C., and the transparent polymer layer of the laminate may be heated to a temperature of 1 to 1.2 times higher than the glass transition temperature (Tg).

When the transparent polymer of the transparent polymer layer has two or more glass transition temperatures, the transparent polymer layer of the laminate may be heated to the lowest glass transition temperature or higher (process temperature) in the sink step, and specifically, may be heated to the lowest glass transition temperature or higher to a temperature less than the highest glass transition temperature.

As a specific example, when the transparent polymer has two glass transition temperatures, wherein a relatively low glass transition temperature is set to a first glass transition temperature and a relatively high glass transition temperature is set to a second glass transition temperature, the transparent polymer layer of the laminate may be heated to the first glass transition temperature or higher and a temperature lower than the second glass transition temperature.

As another specific example, when the transparent polymer has three glass transition temperatures, wherein a first glass transition temperature, a second glass transition temperature, and a third glass transition temperature are set in a direction from a relatively low temperature to a high temperature, the transparent polymer layer of the laminate may be heated to the first glass transition temperature or higher and a temperature lower than the third glass transition temperature.

The lowest glass transition temperature (the lowest glass transition temperature among the two or more glass transition temperatures) of the transparent polymer may be to 140° C., specifically 100 to 140° C., and more specifically 110 to 130° C.

The heating of the transparent polymer layer may be performed by indirect heating in which energy for heating is transferred through the substrate located at a lower portion of the transparent polymer layer and/or by direct heating in which energy for heating is transferred to the transparent polymer layer without passing through the substrate. The indirect heating may include a case where the heat source is located in a lower portion of the substrate, and the direct heating may include a case where the heat source is located in an upper portion of the substrate.

As the transparent polymer layer is heated to a process temperature in the sink step, the conductive network may sink into the transparent polymer layer due to gravity acting on the conductive network.

Here, optionally, an external force may be further applied from the conductive network toward the transparent polymer layer with respect to the laminate, together with the gravity. The external force may include a pressure transferred through a pressure transferring member such as a plate, a roller, or the like, or a gas phase having a pressure having atmospheric pressure or higher.

A time required for maintaining the process temperature may be appropriately controlled depending on a degree to which the conductive network is intended to sink. As a specific and non-limiting example, when all the conductive networks are intended to stably sink into the transparent polymer layer, the process may be maintained for 10 seconds to 200 seconds, more substantially for 30 seconds to 100 seconds at the process temperature, but this maintenance time may be appropriately controlled depending on density of the conductive network or the material of the conductive network, the material of the transparent polymer layer, and the process temperature.

After the sink step is performed, a cooling step for cooling the transparent polymer layer may be performed.

The cooling step may be performed when the sink of conductive network is not practically generated any more.

However, optionally, the transparent polymer layer may be cooled during the step in which the conductive network sinks. By cooling the transparent polymer layer during the step in which the conductive network sinks, a portion of the conductive network corresponding to a designed amount may be loaded into the transparent polymer layer and a remaining portion of the conductive network may protrude over the surface of the transparent polymer layer.

Here, the amount at which the conductive network protrudes over the surface of the transparent polymer layer may be controlled by a cooling time point of the transparent polymer layer.

The cooling of the transparent polymer layer may be natural air cooling or artificial cooling using a cooling fluid. The artificial cooling may be performed by providing a conventional cooling means at the lower portion of the substrate or by contacting the transparent polymer layer with cooled liquid or cooled gas.

Application of Light Energy

The light energy is commercially more suitable since it is capable of preparing the transparent conductor without damaging the flexible substrate vulnerable to heat, and performing mass-production easily and quickly.

After the laminate is prepared, the step of applying light energy to the transparent polymer layer so that the conductive network sinks into the transparent polymer layer, may be performed. The light energy of the sink step may include infrared rays, ultraviolet rays, visible light, white light, or a composite light which is a combination thereof.

Specifically, the light energy of the sink step may be a light that is able to heat the transparent polymer layer, and/or a light that is able to at least partially heat (soften) the transparent polymer region located in contact with a lower portion of the conductive network by the light energy absorbable by the conductive network.

The light capable of heating the transparent polymer layer may include infrared rays. The infrared rays mean a light in a wavelength band of 0.75 μm to 1 mm, and is called a hot wire since it has a stronger heat action than that of visible light or ultraviolet ray as known in the art. The infrared rays may include near infrared rays having a wavelength of 0.75 to 3 μm, infrared rays having a wavelength of 3 to 25 μm, far infrared rays having a wavelength of 25 μm to 1 mm, or a combination thereof. The infrared rays of the sink step may be irradiated at 100 to 1000 W/cm$^2$ for 5 seconds to 5 minutes, but the present invention is not limited by intensity and an irradiation time of infrared rays to be irradiated.

The light absorbable by the conductive network may mean a light including a light at a wavelength corresponding to a light absorption peak in a UV-visible light spectroscopy spectrum of the conductive network (conductive nano unit) (hereinafter, a conductive network light absorption wavelength). As a specific example, when the conductive network light absorption wavelength has a visible light range, specifically 430 to 600 nm, more specifically 400 to 800 nm, and more particularly 350 to 950 nm, a light absorbable by the conductive network may be the white light. The white light may be irradiated in a pulse-type in order to prevent the conductive nano unit constituting the conductive network from being damaged by excessive light energy. As an example, the intensity of the white light may be 300 to 1000 W/cm$^2$, and a pulse width, an interval between pulses, and the number of pulses to be irradiated may be sufficient as long as damage to the substrate is able to be prevented and the transparent polymer adjacent to the conductive network may be softened by the light energy absorbed by the conductive network. As a non-limiting example, the pulse width may be 1 msec to 10 msec, the interval between pulses (pulse gap) may be 1.5 to 3 times the pulse width, and the number of pulses to be irradiated may be 1 to 30.

As described above, in the sink step, light including infrared ray, light including white light, or light including infrared ray and white light may be irradiated. Here, the heat energy may be directly or indirectly applied together with the light energy so that a faster and stable conductive network sinks.

Light Sintering and Conductive Network Sinks by Light Energy

After the laminate is prepared, the light energy may be irradiated to perform both the fusion (light sintering) between the conductive nano units constituting the conductive network, and the sink in which the conductive network integrated by the light sintering sinks into the transparent polymer layer.

Unlike the sintering by heat, when the organic material acting as a binder or a dispersing agent is mixed with the nano unit, there is a limitation in that the light sintering of the nano unit does not easily occur.

However, in order to prepare the transparent conductor having uniform electrical characteristics even in a large area, it is required to add the organic material acting as the binder or the dispersing agent to the dispersion liquid of the nano unit.

Accordingly, it is attempted to provide a constitution in which the light sintering is performed smoothly and the sink by light is performed even when the organic material including a polymer is added to the dispersion liquid as an additive.

When the conductive nano units are dispersed and bonded on the substrate by the organic binder, conventionally known techniques such as light sintering using a xenon lamp, etc., have problems in that the light sintering in which regions including the nano units in contact with each other are selectively melted and bonded without damaging the nano units, is hardly achieved, and when only the nano units are dispersed without adding the organic material to the dispersion liquid, it is difficult to secure uniformity of sheet resistance in a large area that is commercially required.

In an exemplary embodiment of the present invention, it is preferred to remove the binder in advance after the dispersion liquid is applied and before the light sintering is performed, wherein the dispersion liquid contains the organic binder, in order to have excellent sheet resistance uniformity even in a large area and to simultaneously perform the light sintering and the sink by light.

Here, when all the binders are removed in advance through the plasma, etc., before the light sintering in which the regions including the nano units in contact with each other are selectively melted and bonded by light, there is a risk that contact points between the nano units may be reduced due to heat stress and deformation occurring when the regions including the nano units in contact with each other are melted and bonded, and binding force with the substrate may also be reduced.

Accordingly, in an exemplary embodiment according to the present invention, it is possible to prepare the transparent conductor having a high sheet resistance uniformity even in a large area, excellent binding force with the substrate, and excellent electric conductivity by partially removing the binder through multi-stage light irradiation in which different lights are irradiated two or more times, and preferably multi-stage light irradiation using a composite light, and performing the light sintering and the sink.

As described above, the dispersion liquid may contain the organic binder together with the dispersion medium (non-solvent with respect to the transparent polymer of the transparent polymer layer) and the conductive nano unit.

The organic binder is preferably a low molecular weight natural polymer or a low molecular weight synthetic polymer in which a molecular weight (weight average molecular weight) is $5 \times 10^5$ or less, and preferably $2 \times 10^5$ or less. When the organic binder is a high molecular weight polymer beyond the above-suggested low molecular weight range, the organic binder present in the contact region may not be removed by light irradiation including ultraviolet rays, and thus, desired light sintering may not be performed. Here, as a practical example, the organic binder may have a molecular weight of 3,000 or more, but the present invention is not limited by a molecular weight lower limit of the organic binder.

The low molecular weight organic binder may be one or two or more selected from polyethylene glycol (PEG), polyvinylpyrrolidone (PVP), polyvinyl alcohol (PVA), polysaccharide, and polysaccharide derivative.

More preferably, the organic binder may be one or two or more selected from low molecular weight polyethylene glycol (PEG) having a molecular weight of 3,000 to 50,000, preferably 3,000 to 20,000, low molecular weight polyvinylpyrrolidone (PVP) having a molecular weight of 3,000 to 60,000, low molecular weight polyvinyl alcohol (PVA) having a molecular weight of 3,000 to 50,000, and low molecular weight polysaccharide having a molecular weight of 3,000 to 200,000, preferably 3,000 to 100,000, and low molecular weight polysaccharide derivative having a molecular weight of 3,000 to 200,000, preferably 3,000 to 100,000.

The low molecular weight polysaccharide may include glycogen, amylose, amylopectin, callose, agar, algin, alginate, pectin, carrageenan, cellulose, chitin, chitosan, curdlan, dextran, fructane, collagen, gellan gum, gum arabic, starch, xanthan, gum tragacanth, carayan, carabean, glucomannan, or a combination thereof. The polysaccharide derivative may include cellulose ester or cellulose ether.

More preferably, the organic binder may be a low molecular weight cellulose ether, and the cellulose ether may include carboxy-C1-C3-alkyl cellulose, carboxy-C1-C3-alkyl hydroxy-C1-C3-alkyl cellulose, C1-C3-alkyl cellulose, C1-C3-alkyl hydroxy-C1-C3-alkyl cellulose, hydroxy-C1-C3-alkyl cellulose, mixed hydroxy-C1-C3-alkyl cellulose or mixture thereof.

As an example, the carboxy-C1-C3-alkyl cellulose may include carboxymethyl cellulose, etc., the carboxy-C1-C3-alkyl hydroxy-C1-C3-alkyl cellulose may include carboxymethyl hydroxyethyl cellulose, etc., the C1-C3-alkyl cellulose may include methylcellulose, etc., the C1-C3-alkyl hydroxy-C1-C3-alkyl cellulose may include hydroxyethyl methylcellulose, hydroxypropyl methylcellulose, ethyl hydroxyethyl cellulose or a combination thereof, etc., the hydroxy-C1-C3-alkyl cellulose may include hydroxyethyl cellulose, hydroxypropyl cellulose, or a combination thereof, and the mixed hydroxy-C1-C3-alkyl cellulose may include hydroxyethyl hydroxypropyl cellulose, or alkoxy hydroxyethyl hydroxypropyl cellulose (wherein the alkoxy group is linear or branched and contains 2 to 8 carbon atoms), etc.

In an exemplary embodiment according to the present invention, the dispersion liquid may contain 0.1 to 5 wt %, preferably 0.1 to 1 wt %, and more preferably 0.1 to 0.7 wt % of an organic binder. The content of the organic binder is a content in which when the dispersion liquid containing the conductive nano units is coated, the organic binder present between the conductive nano units in the contact region may be minimized while the conductive nano unit may be uniformly and homogeneously coated on the substrate, and thus, it is able to stably remove the organic binder present at least in the contact region by light irradiation including ultraviolet rays.

The aspect ratio and the content of the conductive nano unit contained in the dispersion liquid, the dispersion medium, etc., are similar to or the same as described above in the 'conductive network'.

The selective removal of the organic binder present in the contact region between the nano units may be performed by irradiating ultraviolet ray under conditions in which the organic binder is not able to be removed by ultraviolet ray itself, wherein the organic binder is able to be finally removed by combining the optical activity of the conductive network composed of the conductive nano units that generate the surface plasmon or that have photocatalytic ability with the ultraviolet ray.

In this regard, the conductive material of the conductive network preferably has the optical activity described above in the conductive network. That is, the nano units of the conductive network may be nanowires, nanotubes, and/or nanobelts of conductive materials that generate surface plasmon or that have photocatalytic ability. Examples of the conductive material having surface plasmon may include one or two or more materials selected from gold, silver, copper, lithium, aluminum, and an alloy thereof, etc. Examples of the conductive material having photocatalytic ability may include one or more metal oxides selected from titanium oxides, zinc oxides, and tin oxide, etc.; and noble metals including gold, silver, platinum, etc. As a specific and non-limiting example, the conductive nano unit having optical activity may include the silver nanowires.

The preparation method may include: after the laminate is manufactured, a first light irradiation step of irradiating nano units coated on a surface of the transparent polymer layer with a first light including a first ultraviolet ray (UV); and a second light irradiation step of irradiating the nano units irradiated with the first ultraviolet ray with a second light including a pulse-type first white light. Specifically, the preparation method may include: after a dispersion liquid containing a binder, an organic binder, a nano unit and a dispersion medium is coated on a transparent polymer layer, a first light irradiation step of irradiating nano units coated on a surface of the transparent polymer layer with a first light including a first ultraviolet ray (UV); and a second light irradiation step of irradiating the nano units irradiated with the first ultraviolet ray with a second light including a pulse-type first white light.

As described above, the light irradiation may be performed by multi-stage light irradiation, and the multi-stage light irradiation may include sequential irradiation of the first light irradiation and the second light irradiation. Specifically, the multi-stage light irradiation may include a pre-removing step in which the organic binder present in the contact regions (including a crossing region of the conductive nano units) where at least the conductive nano units are in contact with each other is removed by the first light irradiation including the first ultraviolet ray, and a fusing step in which the contact regions where the conductive nano units are in contact with each other are melted and bonded to each other by the second light irradiation including the first white light. Here, when the first light irradiation and the second light irradiation are sequentially performed independently of each other, there may be a rest period between the first light irradiation and the second light irradiation.

As described above, in an exemplary embodiment according to the present invention, the first light to be irradiated during the first light irradiation may include a first ultraviolet (UV) ray, and the organic binder contained in the dispersion liquid and applied on the substrate which is the same as the conductive nano unit, may be removed by the first ultraviolet rays. In detail, the organic binder present in the contact region between the conductive nano units coated on the substrate may be partially or entirely decomposed and removed by the first light.

The first ultraviolet rays may mean a light having a wavelength ranging from 10 nm to 400 nm, and as known in the art, the ultraviolet rays are called a chemical ray since it causes a very strong chemical action. The first ultraviolet ray may include UV-A in the wavelength band of 320 to 400 nm, UV-B in the wavelength band of 280 to 320 nm, UV-C in the wavelength band of 100 to 280 nm, or a combination thereof. Here, the first ultraviolet rays may include UV-C which is more effective for decomposing the organic materials. Here, unless light irradiation forms of the specially irradiated light such as the pulse type light are specifically mentioned, all of the lights to be irradiated may be in a continuous light form in which light is continuously irradiated for a predetermined time. As an example, the first ultraviolet ray may also be irradiated in a continuous light form, as the light irradiation form of the first ultraviolet rays is not particularly limited.

As described above, in the case where the coated organic binder is all decomposed and removed by the first light which is the same as the conductive nano unit on the substrate, when the conductive nano unit is fused by the second light, the binding force with the substrate may be reduced due to the distortion of the conductive nano units, the contact points between the nano units may be reduced, and the sheet resistance of the conductive nano unit network may be increased. In order to prevent these problems, it is preferred that the organic binder present in the contact region where the conductive nano units are in contact with each other may be selectively removed by the first light. Here, the selective removal of the organic binder present in the contact area means that the organic binder remains on the substrate even after the first light irradiation, and further, may mean that in a region other than the contact region, the conductive nano unit is bonded to the substrate by the organic binder.

The selective removal of the organic binder present in the contact region may be performed by irradiating the first ultraviolet rays under conditions in which the organic binder is not able to be removed by the first light itself, specifically, the first ultraviolet ray itself included in the first light, wherein the organic binder is able to be finally removed by combining the optical activity of the conductive nano units that generate the surface plasmon and/or that have photocatalytic ability with the first ultraviolet ray.

That is, the organic binder located at least in the contact region may be selectively removed by combining the optical activity provided by the conductive nano unit with the first ultraviolet rays.

In order to finally remove the organic binder in the presence of the optical activity provided by the conductive nano unit while the organic binder is not removed by the first light itself, specifically, the first ultraviolet ray itself included in the first light, the intensity of the first ultraviolet ray may satisfy Relational Equation 2 below at the time of the irradiation with the first light.

$$I_{IR}(exp) < I_{IR}(0) \quad \text{(Relational Equation 2)}$$

In Relational Equation 2, $I_{IR}(exp)$ is an intensity of a first ultraviolet ray at the time of the first light irradiation, and $I_{IR}(0)$ is a maximum intensity at which a weight reduction rate according to Relational Equation 3 is 1% or less when a pure organic binder film is irradiated with a first ultraviolet ray for 1 minute. Here, the film of the organic binder may be any film as long as it has a thickness suitable for measuring a weight reduction rate, and as a non-limiting example, the film may have a thickness of 100 to 800 nm.

$$(M_0 - M_1)/M_0 * 100 \quad \text{(Relational Equation 3)}$$

In Relational Equation 3, $M_1$ is a weight of the organic binder film defined in Relational Equation 2 after the first ultraviolet ray irradiation, and $M_0$ is a weight of the organic binder film defined in Relational Equation 2 before the first ultraviolet ray irradiation.

That is, as suggested by Relational Equations 2 and 3, when the organic binder contained in the conductive nano unit dispersion liquid is not mixed with the conductive nano unit but forms a pure organic binder film, the irradiation is preferably performed at an intensity of the first ultraviolet ray in which the organic binder are not substantially decomposed and removed (weight reduction rate according to Relational Equation 3 is 1% or less) by the light irradiation with the first ultraviolet ray for 1 minute. The intensity that satisfies Relational Equation 2 may be determined to some extent depending on the kind of the organic binder. However, when the organic binder of the low molecular weight natural polymer or the low molecular weight synthetic polymer as described above, the first ultraviolet ray of the first light may be irradiated at an intensity of 0.1 to 5 mW/cm$^2$. The first ultraviolet ray may be irradiated for 1 to 200 seconds, but the present invention is not limited by the irradiation time of the first ultraviolet ray.

The selective removal of the organic binder may be performed by the intensity of the first ultraviolet ray, and further, in particular, when a transparent conductor is intended to be prepared on a substrate which is thermally or chemically weak, it is possible to fundamentally prevent the substrate from being damaged by ultraviolet rays.

It is preferred that all the organic binders present in the contact region of the conductive nano unit, specifically, the organic binders located at the contact point between the one conductive nano unit and the other conductive nano unit forming the contact point are removed as much as possible by the irradiation of the first light including the first ultraviolet ray.

However, when the irradiation time of the first ultraviolet ray is excessively long to remove all the organic binders in the contact region, productivity may be lowered. In consideration of the productivity of the continuous process substantially including the roll-to-roll process, it is preferred that the irradiation time of the first ultraviolet ray is as short as possible.

Accordingly, in removing the organic binder present in the contact region by using the first ultraviolet ray and the optical activity of the conductive nano unit, the first light may further include a pulse-type second white light together with the first ultraviolet ray in order to more completely remove the organic binder present in the contact region while the first ultraviolet ray is irradiated for a short time.

That is, in an exemplary embodiment according to the present invention, the first light may further include the pulse-type second white light together with the first ultraviolet ray.

The pulse-type second white light may further promote decomposition of the organic binder by the first ultraviolet ray. It is generally known that the binder is appropriately a polymer organic material having a larger molecular weight than a monomolecular organic material in order to well perform a desired role as a binder. The polymer organic material has very wide physical properties compared to single molecules, and is inevitably decomposed and removed more slowly due to the specific characteristic of the polymer.

When strong energy is momentarily supplied several times through the pulse-type second white light during the process in which the organic binder is decomposed by the first ultraviolet ray in the presence of the optical activity provided by the conductive nano unit, a decomposition speed of the organic binder may be improved.

In particular, in the case where the conductive nano unit is a metal nanowire in which surface plasmon is generated, when the first light including the first ultraviolet ray is irradiated, and the pulse-type second white light is irradiated simultaneously, the organic binder present in the contact region between the conductive nano units may be more thoroughly removed by a hot spot which is the contact region between the conductive nano units. Here, as well known in the plasmonic field, the hot-spot refers to a region where a very strong local electric field is formed, and may mean a contact point between metal nano units that generate surface plasmon, nano gap, etc.

The second white light may mean a light including visible light including red, green and blue light, and may mean a light having a continuous wavelength throughout the whole area of at least 430 to 600 nm, specifically, a light having a continuous wavelength throughout the whole area of at least 400 nm to 800 nm, and more specifically, a light having a continuous wavelength throughout the whole area of at least 350 nm to 950 nm. For example, the light source of the second white light may be a xenon lamp, but the present invention is not limited by the light source of white light.

In an exemplary embodiment according to the present invention, the second white light is basically a light having a wavelength ranging from visible light, specifically at least a region of 430 to 600 nm, more specifically at least a region of 400 nm to 800 nm, and more specifically a region of 350 nm to 950 nm, and the second white light may include light (nano unit light absorption wavelength) at a wavelength corresponding to the light absorption peak of the conductive nano unit in the UV-visible light spectroscopy spectrum of the conductive nano unit. Specifically, when the nano unit light absorption wavelength has a range of visible light, specifically 430 to 600 nm, more specifically 400 nm to 800 nm, and more specifically 350 nm to 950 nm, the second white light including the nano unit light absorption wavelength may be formed only by the light source of white light, and when the nano unit light absorption wavelength is different from the wavelength of the white light described above, the second white light may be a light generated by combining other light sources generating the nano unit light absorption wavelength together with the white light source.

The pulse-type second white light for promoting the decomposition of the organic binder located in the contact region to more effectively and selectively remove the organic binder in the contact region may satisfy Relational Equation 4 below:

$$I_{IPL2}(\exp) < I_{IPL2}(0) \qquad \text{(Relational Equation 4)}$$

in Relational Equation 4, $I_{IPL2}(\exp)$ is an intensity of the second white light upon the first light irradiation, and $I_{IPL2}(0)$ is the minimum intensity at which fusion is generated in the contact region between the conductive nano units when the second white light in a single pulse type with a pulse width of 10 msec is applied to a reference body, wherein the reference body is formed by coating and drying a reference dispersion liquid which is the same as that of the conductive nano unit dispersion liquid but does not contain the organic binder. More specifically, the $I_{IPL2}(0)$ is the minimum intensity at which fusion is generated in the contact region between the conductive nano units when the second white light in a single pulse type with a pulse width of 10 msec is applied to the reference body, wherein the reference body is formed by coating and drying the reference dispersion liquid including the conductive nano unit and the dispersion medium.

That is, after the organic binder present in the contact region is decomposed and removed in advance by the first light, the fusion is preferably performed in the contact region by the second light independently of the decomposition of the organic binder. Accordingly, as suggested in Relational Equation 4, it is preferred that the pulse-type second white light included in the first light is irradiated at an intensity in which the decomposition of the organic binder is facilitated, but partial melting of the conductive nano units is not caused in the contact region between the conductive nano units.

As described above, the intensity of the second white light may be appropriately controlled within the range in which Relational Equation 4 is satisfied, according to the material or the nanostructure of the conductive network. As a more specific and practical example, the intensity of the second white light may be 300 to 1000 W/cm² based on a silver nanowire network which is a typical material of forming a conductive network and a material having typical optical activity. The pulse width, the interval between pulses, and the number of pulses to be irradiated of the second white light may be appropriately controlled within a range in which it is possible to prevent damage to the substrate and to promote the decomposition and removal of the organic binder. As a non-limiting example, the pulse width of the second white light may be from 1 msec to 10 msec, and the interval between pulses (pulse gap) may be 1.5 to 3 times the pulse width.

It is preferable that the irradiation of the second white light may be multi-pulse irradiation since the pulses of the second white light satisfying Relational Equation 4 are irradiated twice or more at regular intervals, the decomposition and removal of the organic binder may be performed faster than the single pulse irradiation. The multi-pulse irradiation may mean that two or more pulses, specifically two to fifty pulses, and more specifically two to twenty pulses are irradiated, but the present invention is not limited by the number of pulses of the second white light to be irradiated in the present invention, and the number of pulses of the second white light to be irradiated may be appropriately controlled according to the material of the organic binder.

As described above, the first light may include a pulse-type second white light together with the first ultraviolet ray. At the time of the irradiation of the first light, the first ultraviolet ray is continuously irradiated, wherein the irradiation of the pulse-type second white light may be performed simultaneously with the irradiation of the first ultraviolet ray, or during the irradiation of the first ultraviolet ray, or immediately before the irradiation of the first ultraviolet ray is stopped. As a specific example, when the total time in which the first ultraviolet ray is irradiated is $t_{uv1}$, the time point at which the pulse-type second white light is irradiated may be the same time as the first ultraviolet ray irradiation which is within $0.9\ t_{uv1}$, based on the time point at which the first ultraviolet ray irradiation begins, but the present invention is not limited by the time point at which the second white light is irradiated.

When the first light including the pulse-type second white light together with the first ultraviolet ray is irradiated, a first ultraviolet ray irradiation time may be remarkably reduced to 1 to 100 sec, specifically, 1 to 60 sec, more specifically, 1 to 20 sec ($t_{uv1}$), and the organic binder of the contact area may be more completely removed.

After the first light irradiation step of irradiating the applied conductive nano unit with the first light including the first ultraviolet ray (UV) is performed, the second light irradiation step of irradiating the conductive nano unit on the substrate with the second light including the pulse-type first white light may be performed.

By the second light irradiation step, the conductive nano units may be physically and integrally combined by melting and combining the contact region between the conductive nano units.

The first white light may mean a light including visible light including red, green and blue light which is similar to the second white light as described above, and may mean a light having a continuous wavelength throughout the whole area of at least 430 to 600 nm, specifically, a light having a continuous wavelength throughout the whole area of at least 400 nm to 800 nm, and more specifically, a light having a continuous wavelength throughout the whole area of at least 350 nm to 950 nm. For example, the light source of the first white light may be a xenon lamp, but the present invention is not limited by the light source of white light.

Further, the first white light may include light (nano unit light absorption wavelength) corresponding to the light absorption peak of the conductive nano unit in the UV-visible light spectroscopy spectrum of the conductive nano unit, which is similar to or the same as the second white light.

The first white light generating binding (fusion) by partial melting in the contact region between the conductive nano units may satisfy Relational Equation 5 below.

$$I_{IPL1}(0) \leq I_{IPL1}(\exp) < I_{IPL1}(c) \quad \text{(Relational Equation 5)}$$

In Relational Equation 5, $I_{IPL1}(\exp)$ is an intensity of the first white light at the time of the second light irradiation, $I_{IPL1}(0)$ is the minimum intensity at which fusion is generated in the contact region between the conductive nano units when the first white light in a single pulse type with a pulse width of 10 msec is applied to a reference body, wherein the reference body is formed by coating and drying a reference dispersion liquid which is the same as that of the conductive nano unit dispersion liquid but does not contain the organic binder, and $I_{IPL1}(c)$ is the minimum intensity at which one conductive nano unit is cleaved into two or more nanostructures by partial melting of the conductive nano unit in a long axis direction when the first white light in a single pulse type with a pulse width of 10 msec is applied to the reference body. More specifically, the $I_{IPL1}(0)$ is the minimum intensity at which fusion is generated in the contact region between the conductive nano units when the first white light in a single pulse type with a pulse width of 10 msec is applied to a reference body, wherein the reference body is formed by coating and drying a reference dispersion liquid including conductive nano units and a dispersion medium, and the $I_{IPL1}(c)$ is the minimum intensity at which one conductive nano unit is cleaved into two or more nanostructures by partial melting of the conductive nano unit in a long axis direction when the first white light in a single pulse with a pulse width of 10 msec is applied to the reference body, wherein the reference body is formed by coating and drying a reference dispersion liquid including conductive nano units and a dispersion medium.

That is, as described above in Relational Equation 5, the first white light may be irradiated at an intensity in which the fusion of the contact region is generated by short pulse irradiation, but damage of the conductive nano unit, for example, unwanted melting, etc., of the conductive nano unit in a region other than the contact region, is not caused.

Relational Equation 5 may be the same as or similar to conditions already established in the conventional method of dispersing the conductive nano units in the dispersion medium and fusing the conductive nano units through light sintering without adopting the organic binder. However, as described above, in the case where the organic binder is adopted for uniform and homogeneous dispersion and contact of the conductive nano units, when the light sintering is performed without removing the organic binder in advance at least in the contact region, the light sintering may not be performed within the range in which the condition of Relational Equation 5 is satisfied. That is, when the conductive nano unit dispersion liquid containing the organic binder and the conductive nano unit is coated and dried, and then, the light sintering is intended to be performed by irradiating the pulse-type white light as in the conventional method rather than the multi-step light irradiation of the first UV-first white light described above, even if the intensity, the pulse width, the number of pulses, the interval between pulses, etc., of the white light are controlled, the conductive nano unit itself is partially melted or deformed and the conductive nano unit itself is damaged, but the desired conductive nano unit network is not prepared.

That is, the condition of the above-described Relational Equation 5 is a condition which is possible by the constitution of the multi-stage light irradiation of the first UV-first white light when the conductive nano unit dispersion liquid containing the organic binder and the conductive nano unit is used.

As described above, the organic binder present in the contact region is firstly removed by the first light irradiation, and then, the contact region is fused by using the pulse-type first white light, and thus, the fusion between the conductive nano units may be achieved under conditions satisfying Relational Equation 5. Further, the organic binder present in the contact region is firstly removed by the first light irradiation, and then, the contact region is fused by using the pulse-type first white light, and thus, the first white light may be irradiated with a short pulse, and even if the first white light is irradiated with a single pulse, the contact regions may be homogeneously fused even over a large area.

As described above, the intensity of the first white light may be appropriately controlled within the range in which Relational Equation 5 is satisfied, according to the material or the nanostructure of the conductive network. As a more specific and practical example, the intensity of the first white light may be 2000 to 3000 W/cm$^2$ based on a silver nanowire network which is a typical material of forming a conductive network and a material having typical optical activity.

The pulse-type first white light satisfying Relational Equation 5 may be irradiated with a short pulse or two to five multi pulses. As described later, when the first white light together with the second ultraviolet ray is irradiated, it is more preferred that very stable and firm fusion is generated even by the irradiation of the single first white light. At the time of the irradiation with the short pulse, the pulse width is sufficient as long as the substrate is not damaged while achieving stable fusion of the conductive nano units. As a specific example, the pulse width may be 5 msec to 15 msec, but the present invention is not limited by the pulse width of the first white light.

When the pulse-type first white light satisfying Relational Equation 5 is irradiated, the contact area of the conductive nano unit may be instantaneously heated to a very high temperature and the fusion between the conductive nano units may be achieved.

In the preparation method according to an exemplary embodiment of the present invention, the second light may include a second ultraviolet ray, an infrared ray or a second ultraviolet ray and an infrared ray together with the pulse-type first white light.

Specifically, the second light may include the second ultraviolet ray together with the pulse-type first white light. Alternatively, the second light may include the pulse-type first white light, the second ultraviolet ray and the infrared ray.

When the second light includes the second ultraviolet ray, it is preferred that the second ultraviolet ray continuously irradiated for a predetermined time is irradiated to the conductive nano unit at least at the same time as the irradiation of the first white light or is irradiated in advance before the irradiation of the first white light. That is, the pulse-type first white light may be irradiated during the irradiation of the second ultraviolet ray. Fusion between the conductive nano units may be performed by simultaneous irradiation of the first white light and the second ultraviolet ray, and the organic binder that is capable of remaining in the substrate (including the conductive nano unit) may be decomposed and removed even after the first light irradiation, thereby improving transparency of the transparent conductor, and the conductive network may sink smoothly into the transparent polymer layer.

Further, by irradiating the second light including the second ultraviolet ray and the first white light, even when the first white light having lower intensity is irradiated with a short pulse, the fusion between conductive nano units may be stably and reproducibly achieved in the contact region.

As described above, in the second light irradiation, the first white light may be irradiated simultaneously with the irradiation of the second ultraviolet ray, or during the irradiation of the second ultraviolet ray, or immediately before the irradiation of the second ultraviolet ray is stopped.

In detail, the second light irradiation may satisfy Relational Equation 6 below:

$$0.5 t_{uv2} \leq t_{p1} < t_{uv2} \qquad \text{(Relation Equation 6)}$$

in Relational Equation 6, $t_{uv2}$ is the total time (sec) in which the second ultraviolet ray is irradiated, and $t_{p1}$ is an irradiation time point of the first white light on the basis of the time point at which the second ultraviolet ray begins to be irradiated. Here, the meaning of $<t_{uv2}$ in Relational Equation 5 means a condition that the first white light is irradiated at the time when the irradiation of the second ultraviolet ray is stopped (immediately before the stop). That is, the first white light may be irradiated after the second ultraviolet ray is already irradiated for at least 0.5 $t_{uv2}$.

When Relational Equation 6 is satisfied, the organic binder remaining even after the first light irradiation may be removed together with the fusion between the conductive nano units, and the transparency of the transparent conductor may be improved.

The second ultraviolet ray may mean a light having a wavelength in the range of 10 nm to 400 nm, which is independent of the first ultraviolet ray. The second ultraviolet ray may include UV-A in the wavelength band of 320 to 400 nm, UV-B in the wavelength band of 280 to 320 nm, UV-C in the wavelength band of 100 to 280 nm, or a combination thereof, which is independent of the first ultraviolet ray.

The intensity of the second ultraviolet ray is also preferably the intensity satisfying Relational Equation 1 as described above based on the first ultraviolet ray. That is, the intensity of the second ultraviolet ray is also an intensity in which the organic binder itself is not removed by the second ultraviolet ray alone, but preferably, the organic binder is able to be removed together with the heat generated when the second white light is irradiated or the optical activity provided by the conductive nano unit. In this respect, when the organic binder is a natural polymer or a synthetic polymer having a low molecular weight as described above, the intensity of the second ultraviolet ray may be 0.1 to 5 mW/cm$^2$, which is independent of the first ultraviolet ray. An irradiation time of the second ultraviolet ray is sufficient as long as the substrate is not damaged when the substrate to which the dispersion liquid of the conductive nano unit is not applied is irradiated. As an example, when the second light including the second ultraviolet ray is irradiated together with the pulse-type first white light, the irradiation time of the second ultraviolet ray may be 1 to 100 sec, specifically 10 to 60 sec, and more specifically 20 to 60 sec ($t_{uv1}$). Here, it is preferred that the first white light is irradiated at the time when the second ultraviolet ray is continuously irradiated for at least 0.5 $t_{uv2}$ or more, as described above through Relational Equation 6 above.

In order that the conductive nano units are fused with each other and then, sink into the transparent polymer layer, it is preferred that the organic binder does not remain in the conductive nano units that are fused with each other to be integrated. That is, it is preferred that the organic binder remaining after the first light irradiation is removed by the second light irradiation. Upon considering this aspect, it is preferred that the second light includes the second ultraviolet ray together with the first white light.

In the preparation method according to an exemplary embodiment of the present invention, the first light and the second light may be irradiated independently of each other, or alternatively, the first light and the second light may be continuously irradiated. Independent irradiation may mean that there is a rest period where light is not irradiated on the conductive nano unit positioned on the substrate after the first light is irradiated. Continuous and sequential irradiation of the first light and the second light may mean that there is no intentional rest period between the irradiation of the first light and the irradiation of the second light. The individual or continuous irradiation may be changed according to design of a preparation process line. At this time, when the second light includes the second ultraviolet ray and the intensity of the second ultraviolet ray is the same as the first ultraviolet ray, the continuous irradiation is performed by irradiating ultraviolet rays continuously for a total of the time of $t_{uv1}$ and $t_{uv2}$, and thus, the first ultraviolet ray of the first light and the second ultraviolet ray of the second light may be realized. When the first light and the second light are continuously irradiated for a predetermined time ($t_{uv1}+t_{uv2}$) by a single ultraviolet lamp, it is easy to construct the process line, the cost is able to be reduced, and it is more easy to manipulate process variables.

As described above, by irradiating the second light including the second ultraviolet ray and the first white light, the conductive network in which the conductive nano units are fused with each other and physically integrated, may be formed.

In addition to this fusion (light sintering), heat (heat generated by absorption of light energy) generated in the contact region of the conductive nano unit upon the irradiation of the first white light irradiated together with the second ultraviolet ray propagates through the conductive network, and thus, the transparent polymer region in contact with the conductive network may be heated so that the conductive network sinks into the transparent polymer layer.

That is, by the second light irradiation step together with the light sintering of the conductive nano units, the conductive network in which conductive nano units are integrally bonded may sink into the transparent polymer layer. Accordingly, the second light irradiation may correspond to the step of applying energy in step b).

In an exemplary embodiment according to the present invention, optionally, infrared rays may be further irradiated at the time of the second light irradiation. In detail, the second light may further include the infrared rays together with the second ultraviolet ray and the first white light.

As described above, the first white light may be irradiated during the irradiation of the second ultraviolet light, and the infrared ray may be irradiated after the irradiation of the first white light or together with the irradiation of the first white light.

Accordingly, the transparent polymer layer may be heated by the infrared ray together with the heat generated in the conductive nano units at the time of the irradiation of the second ultraviolet ray and the first white light, and thus, the conductive network may sink into the transparent polymer layer more smoothly.

The infrared ray means a light having a wavelength in the range of 0.75 μm to 1 mm, and is also called a heat light since it has a stronger heat action than that of the visible light or the ultraviolet ray, as known in the art. The infrared ray may include near infrared rays having a wavelength of 0.75 to 3 μm, infrared rays having a wavelength of 3 to 25 μm, far infrared rays having a wavelength of 25 μm to 1 mm, or a combination thereof.

The intensity and the irradiation time of the infrared ray may be sufficient as long as the transparent polymer layer may be softened by the irradiation of the second ultraviolet ray simultaneously with or after the irradiation of the first white light while preventing damage to the substrate. As a specific example, the infrared ray may be irradiated at 100 to 1000 W/cm$^2$ for 5 to 100 seconds, but the present invention is not limited by the intensity and the irradiation time of the infrared ray to be irradiated.

However, as described above, as the conductive network sinks into the transparent polymer layer only by the second ultraviolet ray and the first white light, the infrared ray may be selectively irradiated.

Transparent Conductor

The present invention includes a transparent conductor prepared by the preparation method as described above.

The present invention includes a transparent conductor prepared by the above-described preparation method, wherein the transparent conductor has a light transmittance of 90% or more and a haze of 1.5% or less.

The present invention includes a display device including the transparent conductor prepared by the preparation method as described above.

The present invention includes a flat liquid crystal display including the transparent conductor prepared by the above-described preparation method.

The present invention includes a touch panel including the transparent conductor prepared by the above-described preparation method.

The present invention includes an electroluminescent device including the transparent conductor prepared by the above-described preparation method.

The present invention includes a photovoltaic cell including the transparent conductor prepared by the preparation method as described above.

The present invention includes an anti-static layer including the transparent conductor prepared by the above-described preparation method.

The present invention includes an electromagnetic wave shielding layer including the transparent conductor prepared by the above-described preparation method.

The transparent conductor according to an exemplary embodiment of the present invention may include: a substrate; and a composite layer on the substrate, wherein the composite layer includes a transparent polymer layer having a glass transition temperature (Tg) of 80° C. or more; and a conductive network embedded in the transparent polymer layer, the conductive network includes a network of one or two or more nano units selected from conductive nanowires, conductive nanotubes, and conductive nanobelts, and a density of the nano unit in an upper region having a thickness of 5% from a surface which is an opposite surface of a lower surface of the composite layer, the lower surface being a surface in contact with the substrate of the composite layer, is relatively larger than a density of the nano unit in a lower region having a thickness of 5% from the lower surface, based on the total thickness of the composite layer.

Experimentally, the density of the nano units in the lower region may correspond to a value obtained by counting the number of nano units located in the lower region and dividing the number by an area of a lower surface. Experimentally, the density of the nano unit in the upper region may correspond to a value obtained by counting the number of nano units located in the upper region and dividing the number by an area of a surface (the same as the area of the lower surface).

In another aspect, the transparent conductor according to an exemplary embodiment of the present invention includes: a substrate; and a composite layer on the substrate, wherein the composite layer includes a transparent polymer layer having a glass transition temperature (Tg) of 80° C. or more, specifically 80 to 140° C., more specifically 100 to 140° C., and much more specifically 110 to 130° C.; and a conductive network partially embedded in the transparent polymer layer, the conductive network includes a network of one or two or more nano units selected from conductive nanowires, conductive nanotubes, and conductive nanobelts, and the number of nano units located on a surface which is an opposite surface of a lower surface is larger than the number of nano units located on the lower surface which is a surface in contact with the substrate of the composite layer. Here, the number of nano units located on the lower surface may mean the number of the nano units per unit area of the lower surface, and the number of nano units located on the surface may mean the number of nano units per unit area of the surface. Here, as described below, a case where the nano unit protrudes from the surface may also be regarded as the nano units located (exposed) on the surface.

The above-described density difference in the nano units between the upper region and the lower region or the difference in the number of nano units between the lower surface and the surface are characteristics that may be shown by first forming the transparent polymer layer on the substrate and heating the transparent polymer layer to the glass transition temperature or higher to be softened so that the conductive network sinks into the softened transparent polymer layer.

The transparent conductor according to an exemplary embodiment of the present invention includes: a substrate; and a composite layer on the substrate, wherein the composite layer includes a transparent polymer layer having a glass transition temperature (Tg) of 80° C. or more, specifically 80 to 140° C., more specifically 100 to 140° C., and much more specifically 110 to 130° C.; and a conductive network partially embedded in the transparent polymer layer, the conductive network includes a network of one or two or more nano units selected from conductive nanowires, conductive nanotubes, and conductive nanobelts.

The partially embedded structure may mean that at least a part of the conductive network has a structure protruding above the transparent polymer layer. A protruding conductive network region, specifically, protruding nano units may be uncoated with the transparent polymer material of the transparent polymer layer on the surface thereof. Specifically, the protruding conductive network region (protruding nano units) may have a surface of the material itself constituting the conductive network.

As described above, the transparent conductor according to an exemplary embodiment of the present invention has a characteristic that a part of the conductive network is embedded in the transparent polymer layer, and this characteristic is typically shown by first forming the transparent polymer layer on the substrate and heating the transparent polymer layer to the glass transition temperature or higher to be softened so that the conductive network sinks into the softened transparent polymer layer.

The protruding conductive network region may be controlled by a degree at which the conductive network sinks into the transparent polymer layer which is softened after heating the transparent polymer layer to the glass transition temperature or higher.

As a specific and non-limiting example, 0.1 to 30 wt % of the total conductive network may protrude over the surface of the transparent polymer layer. That is, 0.1 to 30 wt % of the nano unit in the total weight of the nano units constituting the conductive network may protrude over the surface of the transparent polymer layer.

Methodically, the transparent conductor according to an exemplary embodiment of the present invention includes a transparent polymer layer formed on a substrate, a composite layer formed by sinking the conductive network, wherein the conductive network may be a network of one or two or more nano units selected from nanowires, nanotubes, and nanobelts.

The transparent conductor according to an exemplary embodiment of the present invention includes the conductive nano unit network in which the conductive nano units are melted and bonded and integrally combined in the contact area between conductive nano units, wherein the transparent conductor has a sheet resistance uniformity of 90% or more as defined by Relational Equation 7 below based on a large area conductive nano unit network having an area of at least 20 mm×20 mm:

sheet resistance uniformity (%)=[1−(sheet resistance standard deviation)/sheet resistance average)]× 100. (Relational Equation 7)

Here, the sheet resistance standard deviation and the sheet resistance average may be obtained by equally dividing an area of at least 20 mm×20 mm into 9 or more areas, and randomly measuring sheet resistance at least 10 times in each divided region, based on a large area transparent conductor having an area of at least 20 mm×20 mm.

The transparent conductor according to an exemplary embodiment of the present invention may have a sheet resistance increase rate of 1.4 or less as defined by Relational Equation 8 below in a bending test in which the transparent conductor is bent 1,000 times with a radius of curvature of 1 cm (two-point bending test), and thus, physical flexibility may be exhibited, and electrical conductivity may be stably maintained even under repeated deformation.

sheet resistance increase rate=sheet resistance after bending test/sheet resistance before bending test. (Relational Equation 8)

The transparent conductor according to an exemplary embodiment of the present invention may have an average sheet resistance of 100 ohm/sq or less.

The transparent conductor according to an exemplary embodiment of the present invention may have a light transmittance of 90% or more and a haze of 1.5% or less. The light transmittance may be measured according to ASTM D 1003, and the haze may be measured according to ASTM D 1003.

In the transparent conductor according to an exemplary embodiment of the present invention, the substrate, the material of the transparent polymer layer, the material and structure of the conductive network, etc., are similar to or the same as those described above, and includes all contents described above in the substrate, the transparent polymer layer, the conductive network, and the energy application.

However, a thickness of the transparent polymer layer may be 50 nm to 10 μm, specifically 50 nm to 2000 nm, and thus, a thickness of the composite layer may be 50 nm to 10 μm, specifically 50 nm to 2000 nm, but these thicknesses are not limited thereto.

However, the composite layer may contain 1 to 30 parts by weight, specifically 5 to 30 parts by weight, more specifically 5 to 15 parts by weight, of the conductive network based on 100 parts by weight of the transparent polymer, but is not limited thereto.

The present invention includes a display device including the transparent conductor as described above.

The present invention includes a flat liquid crystal display including the transparent conductor as described above.

The present invention includes a touch panel including the transparent conductor as described above.

The present invention includes an electroluminescent device including the transparent conductor as described above.

The present invention includes a photovoltaic cell including the transparent conductor as described above.

The present invention includes an anti-static layer including the transparent conductor as described above.

The present invention includes an electromagnetic wave shielding layer including the transparent conductor as described above.

As an example for experimentally demonstrating superiority of the present invention, there is provided an example of applying heat energy.

Example 1

A transparent polymer layer having a thickness of 1000 nm was formed on a polyethylene terephthalate (PET) substrate by using a transparent polymer layer having a glass transition temperature of 118.39° C. An aqueous dispersion liquid in which silver nanowires are dispersed in a deionized water which is a non-solvent for the transparent polymer, as a dispersion medium, was coated on the transparent polymer layer and dried to form a silver nanowire network.

The silver nanowires had an average diameter of 25 nm and an aspect ratio of 1000, and the silver nanowire dispersion liquid was coated so as to form 15 parts by weight of the silver nanowire network based on 100 weight parts of the transparent polymer layer.

Hereafter, the transparent polymer layer was heated to 120° C., maintained at 120° C. for 90 seconds, and cooled to prepare a transparent conductor.

A light transmittance and a haze of the substrate were 92.57% (light transmittance) and 0.78% (haze), respectively, and the light transmittance and the haze of the substrate on which the transparent polymer layer is formed were 92.25% and 0.54%. The prepared transparent conductor had a light transmittance of 91.31%, a haze of 1.2%, and a sheet resistance of 70 to 100 ohm/sq.

It was confirmed from scanning electron microscope observation that all silver nanowire networks sunk into the transparent polymer layer.

As an example for experimentally demonstrating superiority of the present invention, there is provided an example of applying light energy.

Example 2

A PET substrate having the same polymer layer as that of Example 1 to which heat energy is applied was used.

Silver nanowires having an average diameter of 20 nm and an average length of 25 μm were used as the conductive nano units. As a result of UV-visible light spectroscopy spectrum, a light absorption peak of the silver nanowire was 355.2 nm. Hydroxypropyl methylcellulose (HPMC) having a weight average molecular weight of 86,000 was used as a binder for preparation of the dispersion liquid, and a deionized water was used as a dispersion medium. 0.15 wt % of silver nanowires and 0.15 wt % of hydroxypropyl methylcellulose were added to the dispersion medium and mixed so that the dispersion liquid contained the silver nanowires and the hydroxypropyl methylcellulose. Then, the dispersion liquid was coated on the substrate having the transparent polymer layer formed thereon by spin coating, and the dispersion liquid was coated so that 15 parts by weight of silver nanowire network was formed based on 100 parts by weight of the transparent polymer layer.

Then, the coated film was irradiated with near infrared rays for 10 seconds at an intensity of 350 W by using a near infrared ray lamp (Adphos L40) to dry the coated film.

After drying, ultraviolet rays (first ultraviolet rays) were irradiated for 20 seconds at an intensity of 0.31 mW/cm$^2$, 0.69 mW/cm$^2$ or 2.78 mW/cm$^2$ using an ultraviolet ray lamp (LUMATEC SUV-DC, UV-C). Then, the transparent conductor was prepared by irradiating 3.13 mW/cm$^2$ of ultraviolet rays (second ultraviolet rays) for 50 seconds, and irradiating a pulse-type white light once with a pulse width of 15 msec and at an intensity of 2800 W/cm$^2$ using a xenon lamp (first light, a wavelength of 350 to 950 nm) immediately before the irradiation of ultraviolet rays (second ultraviolet rays) is stopped.

It was confirmed from further experiments that when the ultraviolet rays were irradiated to a pure HPMC film having a thickness of 500 nm at an intensity of 2.78 mW/cm$^2$ for 20 minutes, a weight loss substantially did not occur. Further, in the same manner as the dispersion liquid, it was confirmed that when a composite film of silver nanowires and hydroxypropyl methylcellulose (HPMC) having a weight ratio of 1:1 was formed on a glass plate, and irradiated with ultraviolet rays of 0.31 mW/cm$^2$ for 20 minutes, and as a result of measuring a weight loss, 0.173% mass reduction occurred based on the total mass including the glass plate. It was confirmed that when C is was measured using X-ray photoelectron spectroscopy (XPS), a mass of pure C, that is, C is which had 61.3 mass % before the UV irradiation, was reduced to 47.36 mass %.

Example 3

Example 3 was performed in the same manner as in Example 2 except that the dried coating film was irradiated with 2.78 mW/cm$^2$ of ultraviolet ray (first ultraviolet ray) for 5 seconds using an ultraviolet ray lamp and a xenon lamp, and the pulse-type white light (second white light) was irradiated 15 times with a pulse width of 5 msec, an interval between pulses of 10 msec, and an intensity of 666 W/cm$^2$ simultaneously with the irradiation of ultraviolet light. Then, the transparent conductor was prepared by irradiating ultraviolet rays (second ultraviolet rays) of 3.13 mW/cm$^2$ for 50 seconds, and irradiating a pulse-type white light (first white light) once with a pulse width of 15 msec and an intensity of 2800 W/cm$^2$ immediately before the irradiation of ultraviolet rays (second ultraviolet rays) is stopped.

Here, it was confirmed that when pure silver nanowires without including a binder were coated on a glass plate, and then, irradiated with a pulse-type white light 15 times at a pulse gap of 10 msec and an intensity of 666 W/cm$^2$, light sintering did not occur.

Figure 2:
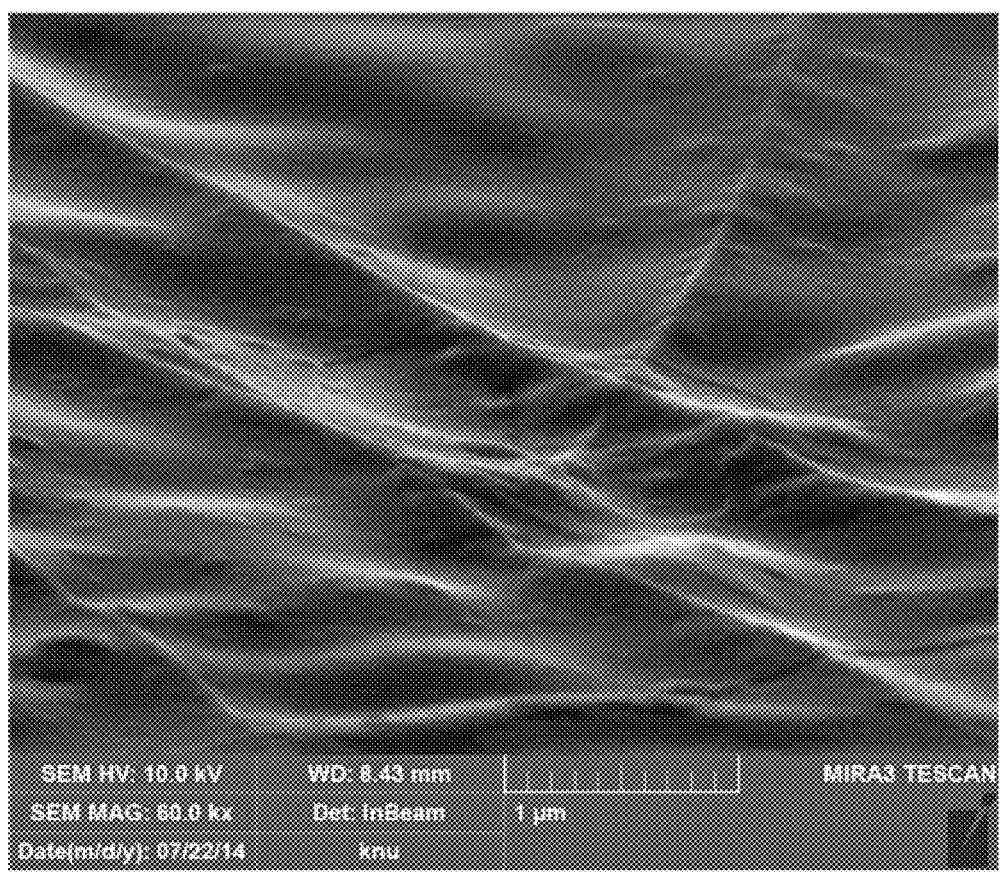
FIG. 2 is a scanning electron microscope (SEM) image showing a surface of a transparent conductor prepared in Example 2 of the present invention.

It was confirmed from the scanning electron microscopic observation that in all of the transparent conductors prepared in Example 2 and Example 3, the fusion between the silver nanowires was smoothly generated to achieve the light sintering, and as shown in FIG. 1 (low magnification) and FIG. 2 (high magnification) in which the transparent conductor prepared in Example 2 was observed by a scanning electron microscope, it was confirmed that the silver nanowire network submerged in the transparent polymer layer only by the ultraviolet ray irradiation (second ultraviolet ray) and the irradiation of the pulse-type white light using the xenon lamp.

The prepared transparent conductor had an area of 20 mm×20 mm. This area was equally divided into 9 regions, and each sheet resistance was measured randomly 10 times for each divided region using a 4-point probe, and sheet resistance averages and sheet resistance deviations were obtained by integrating measurement results of all the divided regions.

It was confirmed that the sheet resistance uniformity of the prepared transparent conductor was 98% or more regardless of the intensity at the time of the first ultraviolet ray irradiation, and it was confirmed that conductivity of the silver nanowire network was improved by the fusion between the silver nanowires, and thus, an average sheet resistance of the transparent conductor was more improved to 83 ohm/sq.

The transparent conductors prepared in Examples had the light transmittance of 91.07% (Example 2) and 91.25% (Example 3), and the haze of 1.22% (Example 2) and 1.23% (Example 3).

A bending test was performed on the prepared transparent conductors. In detail, the bending test was performed 1000 times under a bending radius of 10 mm through a two-point bending test. All of the transparent conductors prepared in Example 2 and Example 3 had a sheet resistance increase rate of 1.4 or less in the bending test in which the transparent conductor was bent 1,000 times with a radius of curvature of 10 mm, and thus, it could be appreciated that stably low sheet resistance was maintained even under repeated physical deformation.

It was confirmed that as a result of observing the silver nanowires exposed after removing the substrate, and etching-removing the transparent polymer layer to a thickness of up to 50 nm from the interface based on the interface between the substrate and the transparent polymer layer in the transparent conductor prepared in Examples 1 to 3, the silver nanowires were not substantially present in the lower region. A sample was prepared in the same manner, and the transparent polymer layer was etching-removed to a thickness of 50 nm from the surface of the transparent polymer layer, and as a result, it was confirmed that the silver nanowires were present in the upper region where etching was removed.

Hereinabove, although the present invention is described by specific matters, limited exemplary embodiments, and drawings, they are provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described exemplary embodiments, and not only the claims to be described below but also all modified equally or equivalently to the claims are intended to fall within the scopes and spirit of the present invention.

The invention claimed is:

1. A preparation method of a transparent conductor, comprising:
    a) preparing a laminate in which a transparent polymer layer and a conductive network having an optical activity including a surface plasmon are sequentially laminated on a substrate; and
    b) applying at least light energy to the laminate so that the conductive network sinks into the transparent polymer layer,
    wherein the at least light energy includes infrared rays, ultraviolet rays, white light, or a composite light which is a combination thereof,
    wherein the application of the at least light energy includes: a first light irradiation step of irradiating the laminate with a first light including at least an ultraviolet ray; and a second light irradiation step of irradiating the laminate irradiated with the first light with a second light including at least a pulse-type white light.

2. The preparation method of claim 1, wherein in step b), heat energy is additionally applied, and the heat energy and the at least light energy are applied simultaneously or sequentially.

3. The preparation method of claim 1, wherein the white light includes light at a wavelength corresponding to a light absorption peak in a UV-visible light spectroscopy spectrum of the conductive network.

4. The preparation method of claim 1, wherein the conductive network is a network of one or more nano units selected from conductive nanowires, conductive nanotubes, and conductive nanobelts.

5. The preparation method of claim 1, wherein the conductive network is a network of one or more nano units selected from silver nanowires, and silver nanobelts.

6. The preparation method of claim 4, wherein the conductive network has a porous structure in which the nano units are physically bonded to each other or a porous structure in which the nano units are formed in contact with or entangled with each other.

7. The preparation method of claim 1, wherein a transparent polymer of the transparent polymer layer has a glass transition temperature of 80 to 140° C.

8. The preparation method of claim 1, wherein a transparent polymer of the transparent polymer layer is one or a mixture of two or more selected from polyester, polyethylene terephthalate (PET), acrylate (AC), polybutylene terephthalate, polymethyl methacrylate (PMMA), acrylic resin, polycarbonate (PC), polystyrene, triacetate (TAC), polyvinyl alcohol, polyvinyl chloride, polyvinylidene chloride, polyethylene, ethylenevinylacetate copolymers, polyvinyl butyral, metal ion-crosslinked ethyl ene-methacrylic acid copolymers, polyurethane, cellophane, and polyolefin.

9. The preparation method of claim 1, wherein step a) includes:
    a1) forming a coating film by coating a first solution containing a transparent polymer or a polymerization unit of the transparent polymer onto the substrate; and
    a2) drying the coating film.

10. The preparation method of claim 9, wherein polymerizing the transparent polymer or the polymerization unit of the transparent polymer of the coating film is further performed after step a2) or simultaneously with step a2).

11. The preparation method of claim 1, wherein the transparent polymer layer is patterned or nonpatterned.

12. The preparation method of claim 1, wherein step a) includes:
    a3) coating a dispersion liquid in which one or more nano units selected from conductive nanowires, conductive nanotubes, and conductive nanobelts are dispersed in a dispersion medium on a surface of the transparent polymer layer of the substrate on which the transparent polymer layer is formed.

13. The preparation method of claim 12, wherein the dispersion liquid further contains an organic binder.

14. The preparation method of claim 13, wherein the organic binder is a natural polymer or a synthetic polymer in which a molecular weight is $5 \times 10^5$ or less.

15. The preparation method of claim 13, wherein the organic binder is one or more selected from the group consisting of polysaccharide including glycogen, amylose, amylopectin, callose, agar, algin, alginate, pectin, carrageenan, cellulose, chitin, chitosan, curdlan, dextran, fructane, collagen, gellan gum, gum arabic, starch, xanthan, gum tragacanth, carayan, carabean, glucomannan, or a combination thereof; polysaccharide derivative including cellulose ester or cellulose ether; polyethylene glycol (PEG); polyvinylpyrrolidone (PVP); and polyvinylalcohol (PVA).

16. The preparation method of claim 12, wherein after step a3), irradiating the coating film on which the dispersion liquid is coated with a light including infrared ray (IR) to dry the coating film is further performed.

17. The preparation method of claim 1, wherein the applied light energy includes the white light, the white light is absorbed by the conductive network, and at least partially softens a transparent polymer region located in contact with a lower portion of the conductive network.

18. The preparation method of claim 1, wherein the applied light energy includes light including infrared ray, light including white light, or light including infrared ray and white light.

19. The preparation method of claim 4, wherein the light energy is irradiated to perform both the fusion between the conductive nano units constituting the conductive network, and the sink in which the conductive network integrated by the light sintering sinks into the transparent polymer layer.

20. The preparation method of claim 13, wherein the energy application includes: a first light irradiation step of irradiating nano units coated on a surface of the transparent polymer layer with a first light including a first ultraviolet ray (UV); and a second light irradiation step of irradiating the nano units irradiated with the first ultraviolet ray with a second light including a pulse-type first white light.

21. A preparation method of a transparent conductor, comprising:
    a) preparing a laminate in which a transparent polymer layer and a conductive network are sequentially laminated on a substrate; and
    b) applying energy to the laminate so that the conductive network sinks into the transparent polymer layer,
    wherein step a) includes coating a dispersion liquid, in which one or more nano units selected from conductive nanowires, conductive nanotubes, and conductive nanobelts are dispersed in a dispersion medium and which contains an organic binder, on a surface of the transparent polymer layer of the substrate on which the transparent polymer layer is formed,
    wherein in step b) an energy application includes: a first light irradiation step of irradiating nano units coated on a surface of the transparent polymer layer with a first light including a first ultraviolet ray; and a second light irradiation step of irradiating the nano units irradiated with the first ultraviolet ray with a second light including a pulse-type first white light, and wherein the nano units have an optical activity including a surface plasmon.

22. The preparation method of claim 21, wherein the second light further includes second ultraviolet ray, second infrared ray, or second ultraviolet ray and second infrared ray.

23. The preparation method of claim 21, wherein the first light further includes a pulse-type second white light.

24. The preparation method of claim 21, wherein in the second light irradiation step, step b) is performed.

25. The preparation method of claim 23, wherein the first white light and the second white light include light at a wavelength corresponding to a light absorption peak of the nano unit in a UV-visible light spectroscopy spectrum of the nano unit, respectively.

* * * * *